(12) United States Patent
Han et al.

(10) Patent No.: US 12,200,978 B2
(45) Date of Patent: Jan. 14, 2025

(54) DISPLAY APPARATUS

(71) Applicant: SAMSUNG DISPLAY CO., LTD., Yongin-si (KR)

(72) Inventors: Byunguk Han, Yongin-si (KR); Chungi You, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 18/482,837

(22) Filed: Oct. 6, 2023

(65) Prior Publication Data

US 2024/0040852 A1 Feb. 1, 2024

Related U.S. Application Data

(63) Continuation of application No. 17/100,521, filed on Nov. 20, 2020, now Pat. No. 11,785,807.

(30) Foreign Application Priority Data

Mar. 9, 2020 (KR) .......................... 10-2020-0029158

(51) Int. Cl.
  *G09G 3/36* (2006.01)
  *H10K 59/122* (2023.01)
  *H10K 59/35* (2023.01)
  *G09G 3/3258* (2016.01)
  *G09G 3/3266* (2016.01)
  *G09G 3/3275* (2016.01)

(52) U.S. Cl.
  CPC ........... *H10K 59/122* (2023.02); *H10K 59/35* (2023.02); *G09G 3/3258* (2013.01); *G09G 3/3266* (2013.01); *G09G 3/3275* (2013.01); *G09G 2330/00* (2013.01)

(58) Field of Classification Search
  CPC .... H10K 59/122; H10K 59/35; G09G 3/3258; G09G 3/3266; G09G 3/3275; G09G 2330/00
  USPC .......................................................... 345/83
  See application file for complete search history.

(56) References Cited

U.S. PATENT DOCUMENTS

| | | | |
|---|---|---|---|
| 9,978,818 | B2 | 5/2018 | Xiong et al. |
| 10,163,995 | B2 | 12/2018 | Hamada et al. |
| 10,304,917 | B2 | 5/2019 | Hayk et al. |
| 10,347,703 | B2 | 7/2019 | Park et al. |
| 10,453,901 | B2 | 10/2019 | Kim et al. |

(Continued)

FOREIGN PATENT DOCUMENTS

| | | |
|---|---|---|
| CN | 104659070 A | 5/2015 |
| CN | 106783927 A | 5/2017 |

(Continued)

*Primary Examiner* — Jennifer T Nguyen
(74) *Attorney, Agent, or Firm* — Lewis Roca Rothgerber Christie LLP

(57) ABSTRACT

Provided is a display apparatus having improved image quality and high resolution, and including a first pixel, a second pixel, and a third pixel spaced apart from one another on a substrate, and configured to emit different respective colors, a pixel defining layer defining openings respectively corresponding to the first pixel, the second pixel, and the third pixel, and defining an emission area, a first dam portion on the pixel defining layer between the first pixel and the second pixel, and a second dam portion on the pixel defining layer between the second pixel and the third pixel.

24 Claims, 17 Drawing Sheets

(56) References Cited

U.S. PATENT DOCUMENTS

| | | | |
|---|---|---|---|
| 11,322,562 B2 | 5/2022 | Liu et al. | |
| 11,785,807 B2 * | 10/2023 | Han | H10K 59/122 |
| | | | 257/89 |
| 2015/0144902 A1 * | 5/2015 | Do | H10K 50/805 |
| | | | 257/40 |
| 2015/0162391 A1 * | 6/2015 | Kim | H10K 50/8428 |
| | | | 257/40 |
| 2016/0268354 A1 | 9/2016 | Xiong et al. | |
| 2017/0010712 A1 | 1/2017 | Yoshizumi et al. | |
| 2017/0256597 A1 * | 9/2017 | Lee | H10K 59/131 |
| 2017/0344141 A1 * | 11/2017 | Lee | G06F 3/0446 |
| 2018/0342563 A1 | 11/2018 | You et al. | |
| 2019/0074329 A1 | 3/2019 | Kim et al. | |
| 2019/0363146 A1 | 11/2019 | Takahashi et al. | |
| 2019/0371865 A1 * | 12/2019 | Lee | H10K 50/11 |
| 2019/0393415 A1 | 12/2019 | Kim et al. | |
| 2020/0335720 A1 * | 10/2020 | Kishimoto | H05B 33/10 |

FOREIGN PATENT DOCUMENTS

| | | |
|---|---|---|
| CN | 110098232 A | 8/2019 |
| JP | 2014-216316 A | 11/2014 |
| JP | 2016-126860 A | 7/2016 |
| JP | 2018-049774 A | 3/2018 |
| JP | 2019-045841 A | 3/2019 |
| JP | 2019-114526 A | 7/2019 |
| KR | 10-2019-0047165 A | 5/2019 |
| KR | 10-2019-0064051 A | 6/2019 |
| KR | 10-2019-0137203 A | 12/2019 |

\* cited by examiner

DISPLAY APPARATUS

CROSS-REFERENCE TO RELATED APPLICATIONS

This application is a continuation of U.S. patent application Ser. No. 17/100,521, filed Nov. 20, 2020, which claims priority to and the benefit of Korean Patent Application No. 10-2020-0029158, filed Mar. 9, 2020, the entire content of both of which is incorporated herein by reference.

BACKGROUND

1. Field

Some embodiments of the disclosure relate to a display apparatus having improved image quality and relatively high resolution.

2. Description of Related Art

Recently, the uses of display apparatuses have been diversified. Furthermore, as the thicknesses and the weights of display apparatuses decrease, the uses thereof have increased.

Among the display apparatuses, an organic light-emitting display apparatus is drawing attention as a next generation display apparatus due to not only its wide viewing angle and superior contrast, but also due to its fast response speed.

In a general organic light-emitting display apparatus, thin film transistors and organic light-emitting devices are formed on a substrate, and the organic light-emitting devices emit light by themselves. The organic light-emitting display apparatus may be used as a display unit of a small product, such as a mobile phone, and also may be used as a display unit of a large product, such as a television.

SUMMARY

However, the display apparatuses described above may have a problem in that a distance between pixels decreases as a resolution increases, and thus a color mixing is generated between the pixels.

Some embodiments of the disclosure provide a display apparatus having improved image quality and high resolution. However, it should be noted that the scope of the disclosure is not limited thereto.

Additional aspects will be set forth in part in the description that follows and, in part, will be apparent from the description, or may be learned by practice of the presented embodiments of the disclosure.

According to an aspect of the disclosure, a display apparatus includes a first pixel, a second pixel, and a third pixel spaced apart from one another on a substrate, and configured to emit different respective colors, a pixel defining layer defining openings respectively corresponding to the first pixel, the second pixel, and the third pixel, and defining an emission area, a first dam portion on the pixel defining layer between the first pixel and the second pixel, and a second dam portion on the pixel defining layer between the second pixel and the third pixel.

The first pixel, the second pixel, and the first dam portion may be arranged in a first direction, and the second pixel, the third pixel, and the second dam portion may be arranged in a second direction crossing the first direction.

A shortest distance between the first pixel and the second pixel may be less than a shortest distance between the first pixel and the third pixel.

The shortest distance between the first pixel and the second pixel may be less than about 17 μm.

The shortest distance between the first pixel and the third pixel may be about 20 μm to about 25 μm.

The first dam portion and the second dam portion may be integrally provided, and may include a same material as the pixel defining layer.

The first dam portion and the second dam portion may include a different material from the pixel defining layer.

The display apparatus may further include a spacer on the pixel defining layer, wherein the first dam portion and the second dam portion include a same material as the spacer.

Each of the first dam portion and the second dam portion may have an inversely tapered shape.

Each of the first dam portion and the second dam portion may include a first sub-dam and a second sub-dam spaced apart from each other by a first distance.

The first distance may be about 1 μm to about 3 μm.

The display apparatus may further include a valley between the first sub-dam and the second sub-dam.

Each of the first dam portion and the second dam portion may have a rectangular shape, in a plan view, with a first width of about 8 μm to about 12 μm in a first axis direction and with a second width of about 4 μm to about 8 μm in a second axis direction that is perpendicular to the first axis direction.

A shortest distance between a corresponding one of the openings of the pixel defining layer and the first dam portion or the second dam portion may be about 3 μm or less.

The first pixel may be configured to emit red light, the second pixel may be configured to emit green light, and the third pixel may be configured to emit blue light.

The first pixel may include a plurality of first pixels, wherein the second pixel includes a plurality of second pixels, wherein the third pixel includes a plurality of third pixels, wherein the plurality of first pixels and the plurality of second pixels are alternately arranged in a third direction, and wherein the plurality of second pixels are arranged in a fourth direction crossing the third direction.

A shortest distance between the first dam portion and the second dam portion in the third direction may be about 3 μm or less.

The first dam portion may include a plurality of first dam portions wherein the second dam portion includes a plurality of second dam portions, wherein each of a shortest distance between the plurality of first dam portions and a shortest distance between the plurality of second dam portions is about 3 μm or less in the fourth direction.

A height of each of the first dam portion and the second dam portion may be about 2 μm or more.

Each of the first dam portion and the second dam portion may include a protruding portion protruding in a minor-axis direction in a plan view.

The protruding portion may have a third width of about 1 μm to about 5 μm in the minor-axis direction, and has a fourth width of about 1 μm to about 5 μm in a major-axis direction.

According to another aspect of the disclosure, a display apparatus includes a first pixel electrode for emitting a first color, and a second pixel electrode for emitting a second color, the first pixel electrode and the second pixel electrode being located apart from each other on a substrate, a pixel defining layer defining a first opening and a second opening for respectively exposing a center portion of each of the first pixel electrode and the second pixel electrode, and defining an emission area, and a first dam portion on the pixel defining layer between the first pixel electrode and the second pixel electrode, wherein a shortest distance between the first opening and the second opening is less than about 17 μm.

The display apparatus may further include a third pixel electrode for emitting a third color located on the substrate, and a second dam portion on the pixel defining layer between the second pixel electrode and the third pixel electrode, wherein the pixel defining layer includes a third opening for exposing a center portion of the third pixel electrode, and wherein a shortest distance between the second opening and the third opening is less than about 17 μm.

The first pixel electrode, the first dam portion, and the second pixel electrode may be arranged in a first direction, wherein the second pixel electrode, the second dam portion, and the third pixel electrode are arranged in a second direction crossing the first direction.

BRIEF DESCRIPTION OF THE DRAWINGS

The above and other aspects of embodiments of the disclosure will be more apparent from the following description taken in conjunction with the accompanying drawings, in which.

DETAILED DESCRIPTION

Figure 1:
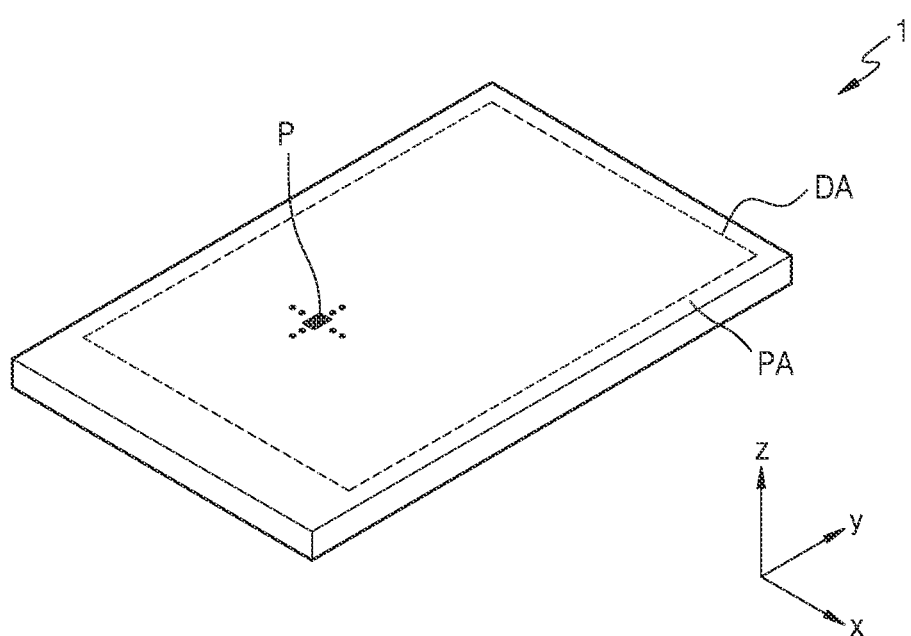
FIG. 1 is a schematic perspective view of a display apparatus according to some embodiments of the disclosure.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display apparatus 1 according to some embodiments of the disclosure.

Referring to FIG. 1, the display apparatus 1 may include a display area DA where an image may be displayed, and a peripheral area PA that is a non-display area where no image is implemented. The display apparatus 1 may provide an image to the outside by using light emitted from a pixel P located in the display area DA.

Although FIG. 1 illustrates the display apparatus 1 in which the display area DA is rectangular, the disclosure is not limited thereto. The shape of the display area DA may be circular, oval, or polygonal such as triangular or pentagonal. Furthermore, although the display apparatus 1 of FIG. 1 is illustrated to be a flat panel display apparatus having a flat shape, the display apparatus 1 may be implemented in various shapes, such as a flexible, bendable, foldable, or rollable display apparatus. When the display apparatus 1 is implemented to be flexible, bendable, or foldable, a part or the whole of the display area DA may be implemented to be flexible, bendable, or foldable.

Figure 2:
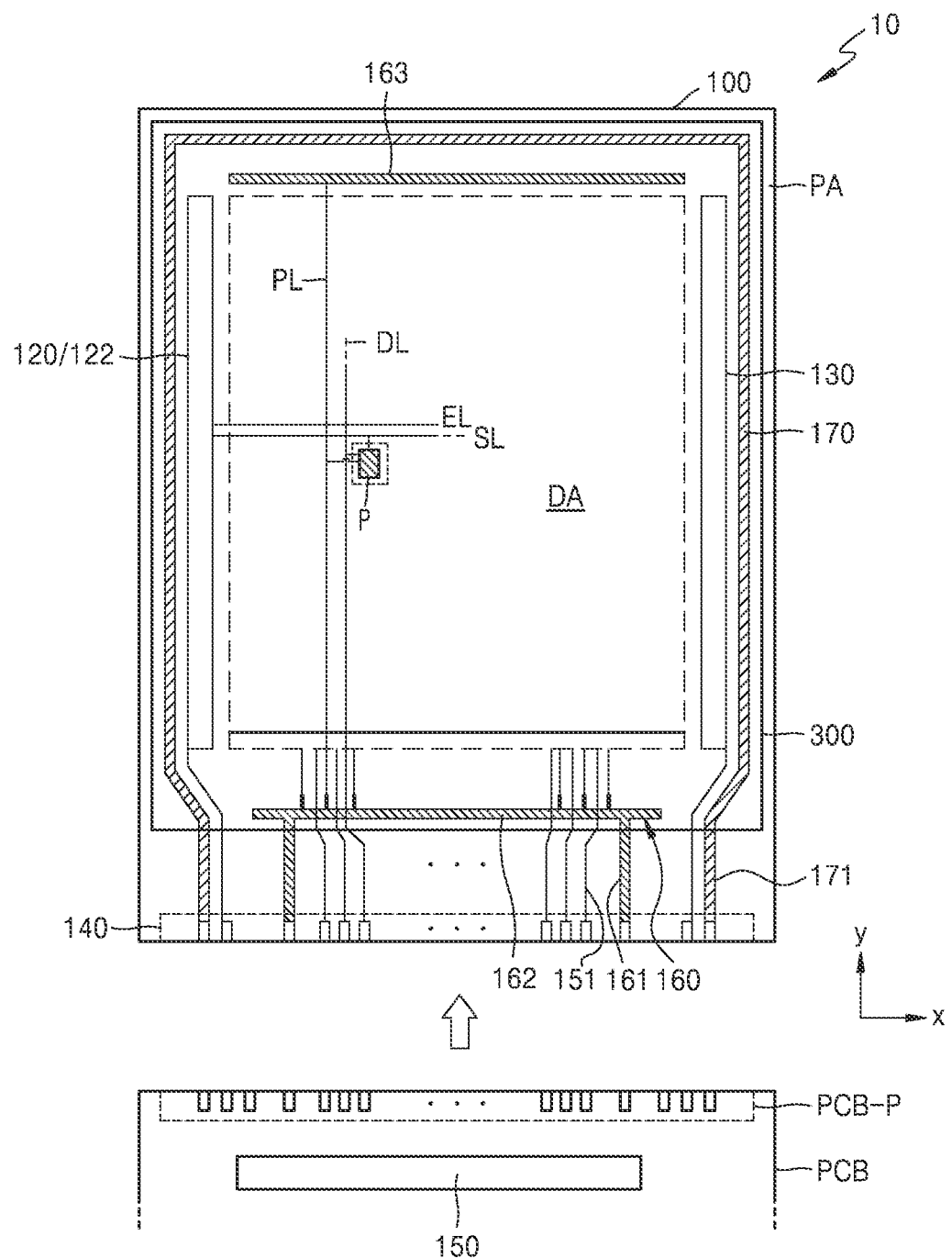
FIG. 2 is a schematic plan view of a display panel according to some embodiments of the disclosure.

In other embodiments, the display apparatus 1 may include a component that is located at one side of a display panel 10 illustrated in FIG. 2. The component may be an electronic element configured to use light or sound. For example, the electronic element may include a sensor that receives and uses light, such as an infrared sensor, a camera that photographs an image by receiving light, a sensor that measures a distance and/or recognizes a fingerprint by outputting and detecting light or sound, a small lamp that outputs light, or a speaker that outputs sound.

In the following description, although an organic light-emitting display apparatus is described as the display apparatus 1, the display apparatus according to other embodiments of the disclosure is not limited thereto. In other embodiments, the display apparatus 1 according to the disclosure may include an inorganic light-emitting display apparatus, an inorganic EL display apparatus, or a quantum dot light-emitting display apparatus. For example, an emission layer of a display component provided in the display apparatus 1 may include an organic material or an inorganic material, quantum dots, an organic material and quantum dots, or an inorganic material and quantum dots.

FIG. 2 is a schematic plan view of the display panel 10 according to some embodiments of the disclosure.

Referring to FIG. 2, the display apparatus 1 may include the pixel P located in the display area DA of a substrate 100. The pixel P may include a display component, such as an organic light-emitting diode OLED. The pixel P may include a plurality of pixels, and may emit light of, for example, red, green, blue, and/or white through the organic light-emitting diode OLED. The pixel P may signify substantially a sub-pixel, and in the display area DA, the pixel P may be a group of pixels or sub-pixels forming one unit pixel.

The display area DA may be protected from external air or moisture by being covered by a thin film encapsulation layer 300. The thin film encapsulation layer 300 may be integrally provided to correspond to the entire surface of the display area DA, and may be partially located in the peripheral area PA. The thin film encapsulation layer 300 may be provided to cover a part of, or the whole of, a first scan driving circuit 120, a second scan driving circuit 130, a data driving circuit 150, a first power supply wiring 160, and a second power supply wiring 170. As the organic light-emitting diode OLED is characteristically vulnerable to external factors such as moisture and oxygen, reliability of the display panel 10 may be improved by sealing the organic light-emitting diode OLED via the thin film encapsulation layer 300. When the display panel 10 includes the thin film encapsulation layer 300 instead of an encapsulation substrate that is described later, the thickness of the display panel 10 may be reduced, and flexibility of the display panel 10 may be improved as well.

In other embodiments, instead of the thin film encapsulation layer 300, an encapsulation substrate may be provided above the substrate 100. The encapsulation substrate may face the substrate 100 with the constituent elements formed on the substrate 100 therebetween. The encapsulation substrate may be in close contact with the substrate 100 via a sealant located in the peripheral area PA, and thus exposure of a display component, such as the organic light-emitting diode OLED, to external air and moisture may be reduced or prevented by sealing the display area DA from the outside.

The pixel P may be electrically connected to outer circuits located in the peripheral area PA. The first scan driving circuit 120, the second scan driving circuit 130, a port 140, the data driving circuit 150, the first power supply wiring 160, and the second power supply wiring 170 may be located in the peripheral area PA.

The first scan driving circuit 120 may provide a scan signal to each pixel P through a scan line SL. An emission control driving circuit 122 may be located at one side of the first scan driving circuit 120. The emission control driving circuit 122 may provide an emission control signal to each pixel through an emission control line EL. The second scan driving circuit 130 may be parallel to the first scan driving circuit 120 with the display area DA therebetween. Some of the pixels P located in the display area DA may be electrically connected to the first scan driving circuit 120, while others of the pixels P may be electrically connected to the second scan driving circuit 130. In other embodiments, the second scan driving circuit 130 may be omitted.

The port 140 may be located at one side of the substrate 100. The port 140 may be exposed (e.g., might not be covered by an insulating layer) to be electrically connected to a printed circuit board PCB. A port PCB-P of the printed circuit board PCB may be electrically connected to the port 140 of the display panel 10. The printed circuit board PCB may transmit a signal or power of a controller to the display panel 10.

A control signal generated by the controller may be transmitted to first and second scan driving circuits 120 and 130 via the printed circuit board PCB. The controller may provide first and second power voltages ELVDD and ELVSS respectively to first and second power supply wirings 160 and 170 via first and second power transmission wirings 161 and 171. The first power voltage ELVDD may be provided to a pixel circuit of the pixel P via a driving voltage line PL connected to the first power supply wiring 160, and the second power voltage ELVSS may be provided to a counter electrode of the pixel P connected to the second power supply wiring 170.

The data driving circuit 150 may be electrically connected to a data line DL. A data signal of the data driving circuit 150 may be provided to each pixel P via a signal transmission wiring 151 connected to the port 140 and the data line DL connected to the signal transmission wiring 151. While FIG. 2 illustrates that the data driving circuit 150 is located on the printed circuit board PCB, in other embodiments, the data driving circuit 150 may be located on the substrate 100. For example, the data driving circuit 150 may be located between the port 140 and the first power supply wiring 160.

The first power supply wiring 160 may include a first sub-wiring 162 and a second sub-wiring 163 that extend parallel to each other in an x direction with the display area DA therebetween. The second power supply wiring 170 having a partial loop shape with one open side may partially surround the display area DA.

Figure 3A:
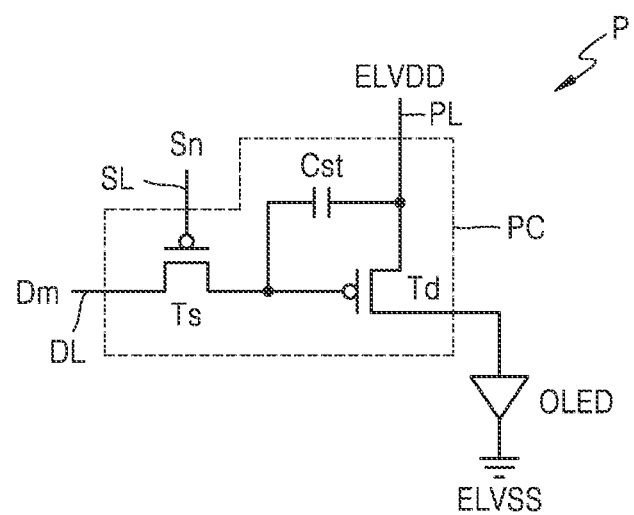
FIGS. 3A and 3B are equivalent circuit diagrams of a pixel that is included in a display apparatus according to some embodiments of the disclosure.
Figure 3B:
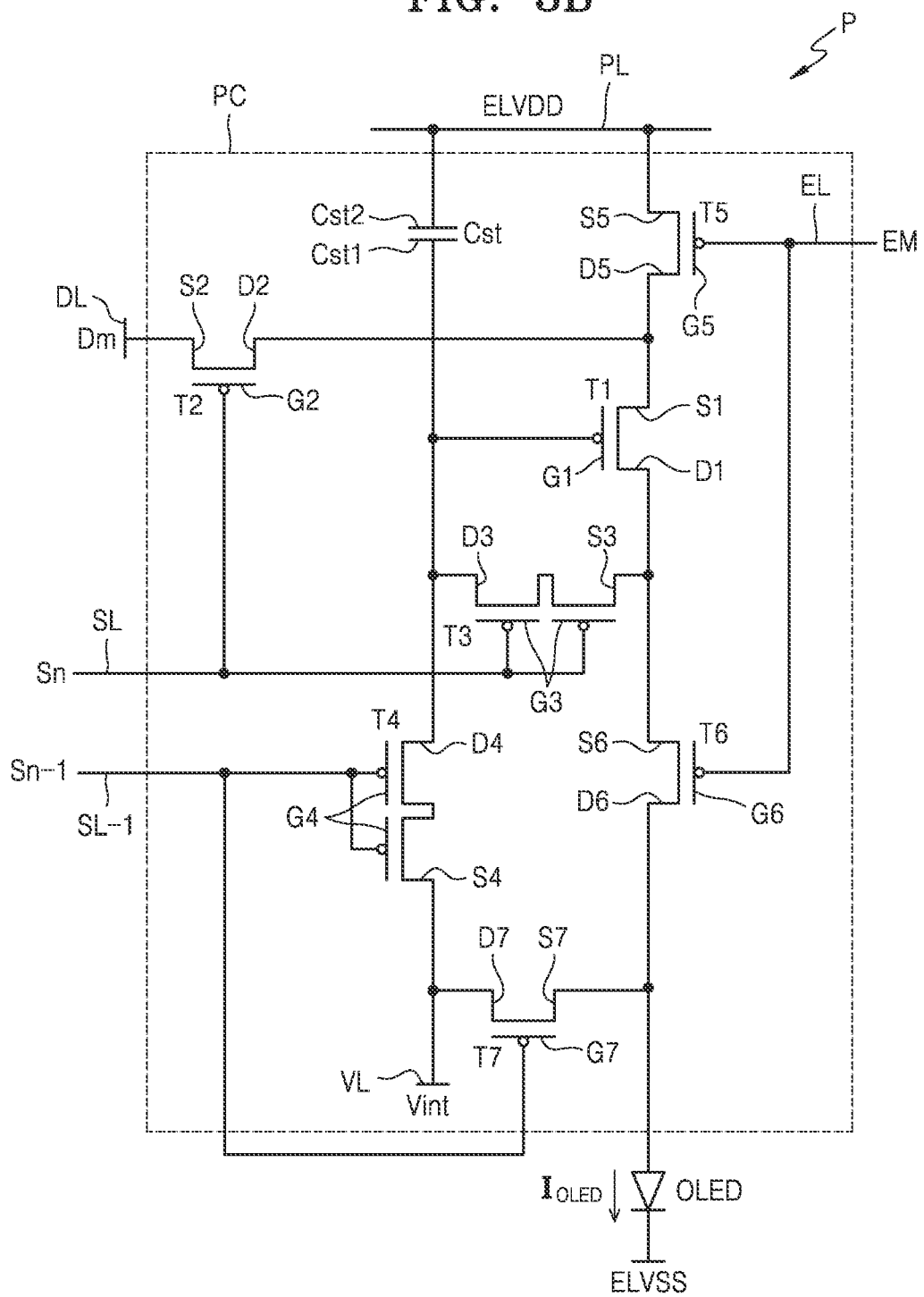

FIGS. 3A and 3B are equivalent circuit diagrams of a pixel that is included in a display apparatus according to some embodiments of the disclosure.

Referring to FIG. 3A, each pixel P may include a pixel circuit PC connected to the driving voltage line PL, to the scan line SL, and to the data line DL, and also may include the organic light-emitting diode OLED connected to the pixel circuit PC.

The pixel circuit PC may include a driving thin film transistor Td, a switching thin film transistor Ts, and a storage capacitor Cst. The switching thin film transistor Ts is connected to the scan line SL and the data line DL, and transmits a data signal Dm received through the data line DL to the driving thin film transistor Td in response to a scan signal Sn input through the scan line SL.

The storage capacitor Cst is connected to the switching thin film transistor Ts and the driving voltage line PL, and stores a voltage corresponding to a difference between a voltage received from the switching thin film transistor Ts and a driving voltage supplied to the driving voltage line PL (e.g., the first power voltage ELVDD).

The driving thin film transistor Td is connected between the driving voltage line PL and the storage capacitor Cst, and may control a driving current flowing from the driving voltage line PL to the organic light-emitting diode OLED in response to a voltage value stored in the storage capacitor Cst. The organic light-emitting diode OLED may emit light having a certain luminance due to the driving current.

Although FIG. 3A illustrates a case in which the pixel circuit PC includes two thin film transistors and one storage capacitor, the disclosure is not limited thereto. In other embodiments, the pixel circuit PC may include, as illustrated in FIG. 3B, seven thin film transistors and one storage capacitor. In other embodiments, the pixel circuit PC may include two or more storage capacitors.

Referring to FIG. 3B, the pixel P may include the pixel circuit PC, and the organic light-emitting diode OLED connected to the pixel circuit PC. The pixel circuit PC may include a plurality of thin film transistors T1-T7 and the storage capacitor Cst. The thin film transistors T1-T7 and the storage capacitor Cst may be connected to the signal lines SL, SL−1, EL, and DL, an initialization voltage line VL, and the driving voltage line PL.

Although FIG. 3B illustrates that each pixel P is connected to the signal lines SL, SL−1, EL, and DL, to the initialization voltage line VL, and to the driving voltage line PL, the disclosure is not limited thereto. In other embodiments, at least one of the signal lines SL, SL−1, EL, or DL, the initialization voltage line VL, and/or the driving voltage line PL may be shared by neighboring pixels.

The thin film transistors T1-T7 may include a driving thin film transistor (driving TFT) T1, a switching thin film transistor (switching TFT) T2, a compensation thin film transistor (compensation TFT) T3, a first initialization thin film transistor (first initialization TFT) T4, an operation control thin film transistor (operation control TFT) T5, an emission control thin film transistor (emission control TFT) T6, and a second initialization thin film transistor (second initialization TFT) T7.

The signal line may include the scan line SL through which the scan signal Sn is transmitted to the driving TFT T1 and the compensation TFT T3, a previous scan line SL−1 through which a previous scan signal Sn−1 is transmitted to the first initialization TFT T4 and the second initialization TFT T7, an emission control line EL through which an emission control signal En is transmitted to the operation control TFT T5 and to the emission control TFT T6, and the data line DL crossing the scan line SL and through which the data signal Dm is transmitted to the switching TFT T2.

The first power voltage ELVDD is transmitted to the driving TFT T1 through the driving voltage line PL, and an initialization voltage Vint for initializing the driving TFT T1 and a pixel electrode of the organic light-emitting diode OLED is transmitted to the first and second initialization TFTs T4 and T7 through the initialization voltage line VL.

A driving gate electrode G1 of the driving TFT T1 is connected to a first storage capacitor plate Cst1 of the storage capacitor Cst, a driving source electrode S1 of the driving TFT T1 is connected to the driving voltage line PL via the operation control TFT T5, a driving drain electrode D1 of the driving TFT T1 is electrically connected to the pixel electrode of the organic light-emitting diode OLED via the emission control TFT T6. The driving TFT T1, in response to a switching operation of the switching TFT T2, receives the data signal Dm and supplies a driving current $I_{OLED}$ to the organic light-emitting diode OLED.

A switching gate electrode G2 of the switching TFT T2 is connected to the scan line SL, a switching source electrode S2 of the switching TFT T2 is connected to the data line DL, and a switching drain electrode D2 of the switching TFT T2 is connected to the driving source electrode S1 of the driving TFT T1 and the driving voltage line PL via the operation control TFT T5. The switching TFT T2 is turned on in response to the scan signal Sn received through the scan line SL and performs a switching operation of transmitting the data signal Dm received through the data line DL to the driving source electrode S1 of the driving TFT T1.

A compensation gate electrode G3 of the compensation TFT T3 is connected to the scan line SL, a compensation source electrode S3 of the compensation TFT T3 is connected to the driving drain electrode D1 of the driving TFT T1 and to the pixel electrode of the organic light-emitting diode OLED via the emission control TFT T6, and a compensation drain electrode D3 of the compensation TFT T3 is connected to the first storage capacitor plate Cst1 of the storage capacitor Cst, a first initialization drain electrode D4 of the first initialization TFT T4, and the driving gate electrode G1 of the driving TFT T1. The compensation TFT T3 is turned on in response to the scan signal Sn received through the scan line SL to electrically connect the driving gate electrode G1 of the driving TFT T1 to the driving drain electrode D1 to thereby diode-connect the driving TFT T1.

A first initialization gate electrode G4 of the first initialization TFT T4 is connected to the previous scan line SL−1, a first initialization source electrode S4 of the first initialization TFT T4 is connected to a second initialization drain electrode D7 of the second initialization TFT T7 and to the initialization voltage line VL, the first initialization drain electrode D4 of the first initialization TFT T4 is connected to the first storage capacitor plate Cst1 of the storage capacitor Cst, to the compensation drain electrode D3 of the compensation TFT T3, and to the driving gate electrode G1 of the driving TFT T1. The first initialization TFT T4 is turned on in response to the previous scan signal Sn−1 received through the previous scan line SL−1 to perform an initialization operation of initializing a voltage of the driving gate electrode G1 of the driving TFT T1 by transmitting the initialization voltage Vint to the driving gate electrode G1 of the driving TFT T1.

An operation control gate electrode G5 of the operation control TFT T5 is connected to the emission control line EL, an operation control source electrode S5 of the operation control TFT T5 is connected to the driving voltage line PL, an operation control drain electrode D5 of the operation control TFT T5 is connected to the driving source electrode S1 of the driving TFT T1 and to the switching drain electrode D2 of the switching TFT T2.

An emission control gate electrode G6 of the emission control TFT T6 is connected to the emission control line EL, an emission control source electrode S6 of the emission control TFT T6 is connected to the driving drain electrode D1 of the driving TFT T1 and to the compensation source electrode S3 of the compensation TFT T3, and an emission control drain electrode D6 of the emission control TFT T6 is electrically connected to a second initialization source electrode S7 of the second initialization TFT T7 and to the pixel electrode of the organic light-emitting diode OLED.

The operation control TFT T5 and the emission control TFT T6 are concurrently, or substantially simultaneously, turned on in response to the emission control signal En received through the emission control line EL to transmit the first power voltage ELVDD to the organic light-emitting diode OLED so that the driving current $I_{OLED}$ flows in the organic light-emitting diode OLED.

A second initialization gate electrode G7 of the second initialization TFT T7 is connected to the previous scan line SL−1, the second initialization source electrode S7 of the second initialization TFT T7 is connected to the emission control drain electrode D6 of the emission control TFT T6 and to the pixel electrode of the organic light-emitting diode OLED, and the second initialization drain electrode D7 of the second initialization TFT T7 is connected to the first initialization source electrode S4 of the first initialization TFT T4 and to the initialization voltage line VL. The second initialization TFT T7 is turned on in response to the previous scan signal Sn−1 received through the previous scan line SL−1 to initialize the pixel electrode of the organic light-emitting diode OLED.

Although FIG. 3B illustrates a case in which the first initialization TFT T4 and the second initialization TFT T7 are connected to the previous scan line SL−1, the disclosure is not limited thereto. In other embodiments, while the first initialization TFT T4 is connected to the previous scan line SL−1 and is driven in response to the previous scan signal Sn−1, the second initialization TFT T7 may be connected to a separate signal line, for example, to a subsequent scan line, and is driven in response to a signal (e.g., a subsequent scan signal Sn+1) transmitted through the signal line.

A second storage capacitor plate Cst2 of the storage capacitor Cst is connected to the driving voltage line PL, and the counter electrode of the organic light-emitting diode OLED is connected to a common voltage ELVSS. Accordingly, the organic light-emitting diode OLED that receives the driving current $I_{OLED}$ from the driving TFT T1 may emit light, thereby displaying an image.

Although FIG. 3B illustrates that the compensation TFT T3 and the first initialization TFT T4 each have a dual gate electrode, the compensation TFT T3 and/or the first initialization TFT T4 may have one gate electrode, respectively.

Figure 4A:
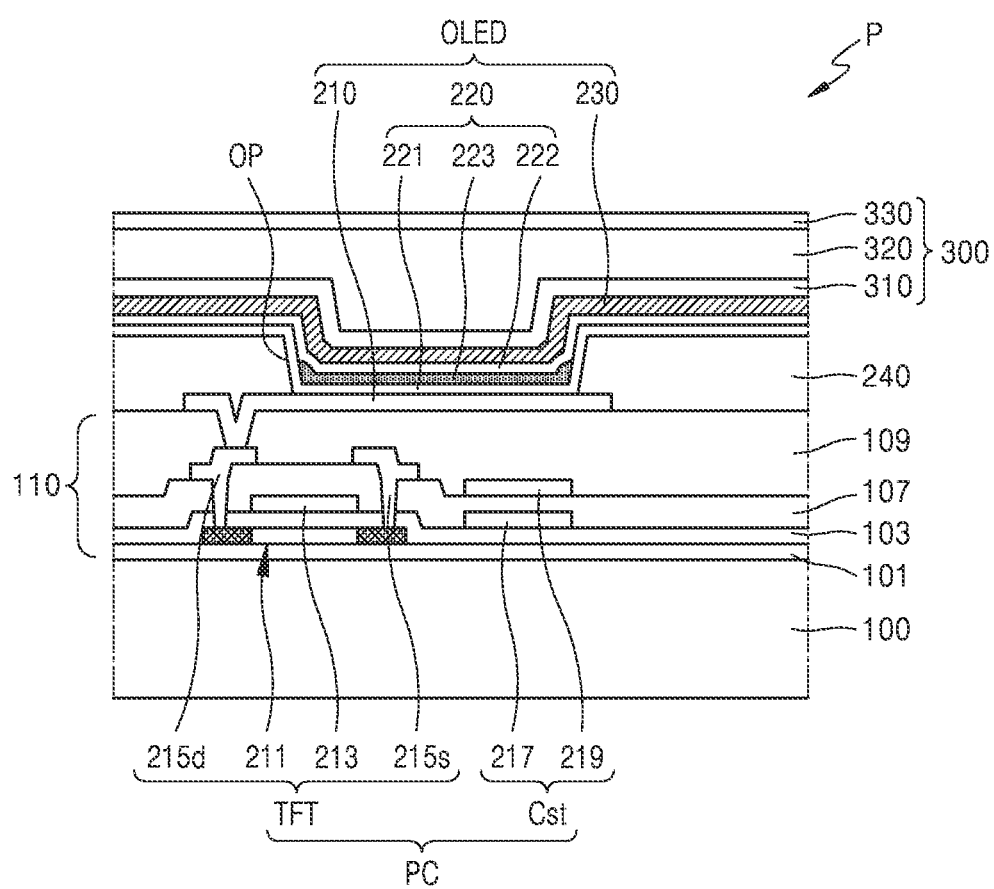
FIGS. 4A and 4B are schematic cross-sectional views of a pixel of a display apparatus according to some embodiments of the disclosure.
Figure 4B:
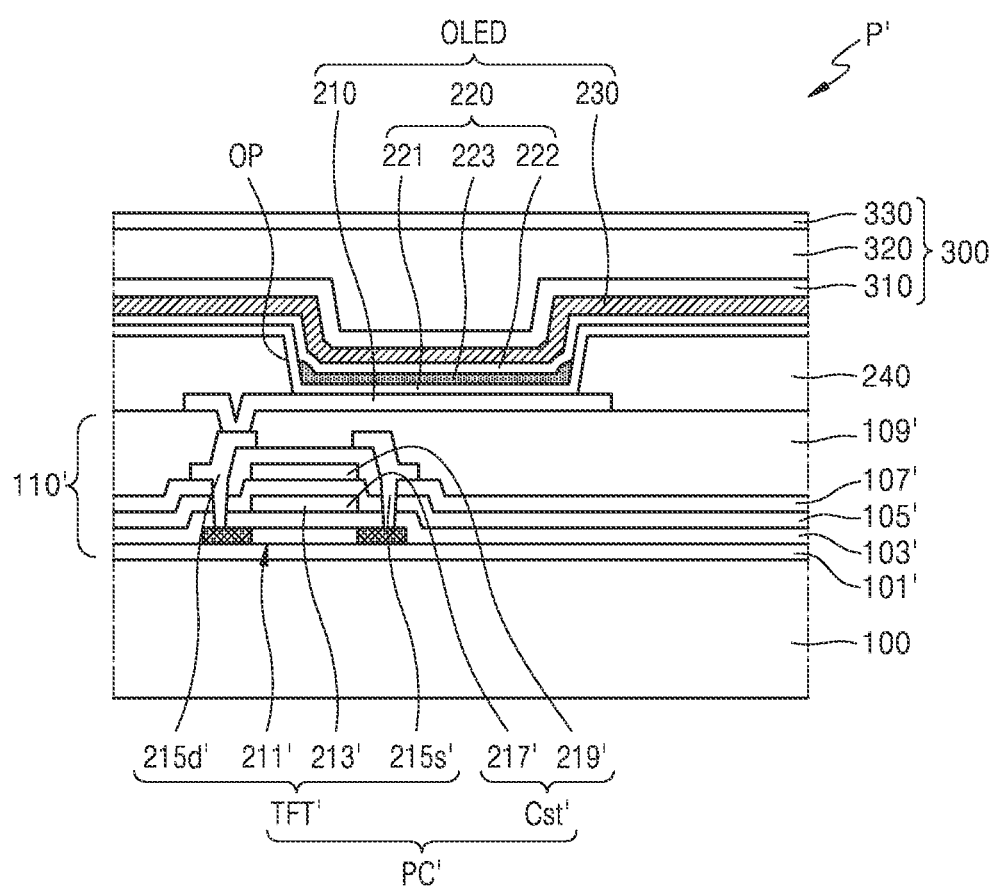

FIGS. 4A and 4B are schematic cross-sectional views of a pixel of a display apparatus according to some embodiments of the disclosure.

Referring to FIG. 4A, first, the pixel P located in the display area DA may include the pixel circuit PC, and the pixel circuit PC may include the thin film transistor TFT and the storage capacitor Cst. The thin film transistor TFT of FIG. 4A may be one of the thin film transistors Td and Ts of FIG. 3A, and for example, may be the driving thin film transistor Td.

A pixel circuit layer 110 may include a buffer layer 101, a gate insulating layer 103, a first interlayer insulating layer 107, and a planarization layer 109, which are sequentially arranged on the substrate 100.

The buffer layer 101 is located on the substrate 100 to reduce or prevent intrusion of impurities, and the gate insulating layer 103 may be provided between a semiconductor layer 211 and a gate electrode 213 of the thin film transistor TFT. The first interlayer insulating layer 107 is provided between the gate electrode 213 of the thin film transistor TFT, a source electrode 215s, and a drain electrode 215d, and also functions as a dielectric by being provided between a lower electrode 217 and an upper electrode 219 of the storage capacitor Cst.

The buffer layer 101, the gate insulating layer 103, and the first interlayer insulating layer 107 may all include an insulating inorganic material. For example, each of the buffer layer 101, the gate insulating layer 103, and the first interlayer insulating layer 107 may include silicon nitride, silicon oxide, and/or silicon oxynitride.

Although FIG. 4A illustrates a case in which the thin film transistor TFT of the pixel circuit PC is a top gate type, the disclosure is not limited thereto. In other embodiments, the thin film transistor TFT may be a bottom gate type.

Furthermore, although FIG. 4A illustrates a case in which the lower electrode 217 and the upper electrode 219 of the storage capacitor Cst are located at the same respective layers as, and include the same material as, the gate electrode 213, and the source electrode 215s and the drain electrode 215d, the disclosure is not limited thereto and may be variously changed.

The organic light-emitting diode OLED may include a pixel electrode 210 electrically connected to the pixel circuit PC with the planarization layer 109 having a contact hole therebetween, a counter electrode 230 facing the pixel electrode 210, and an intermediate layer 220 between the pixel electrode 210 and the counter electrode 230. In some embodiments, the planarization layer 109 may include an insulating organic material.

The pixel electrode 210 is exposed through an opening OP provided in a pixel defining layer 240, and an edge of the pixel electrode 210 may be covered by the pixel defining layer 240 including an insulating organic material. In some embodiments, the pixel electrode 210 may include silver (Ag), magnesium (Mg), aluminum (Al), platinum (Pt), palladium (Pd), gold (Au), nickel (Ni), neodymium (Nd), iridium (Ir), chromium (Cr), and/or a compound thereof.

The counter electrode 230 is integrally formed to entirely cover the display area DA. In some embodiments, the counter electrode 230 may include a thin film metal layer containing Ag and Mg, or a transparent conductive oxide (TCO) such as an indium tin oxide (ITO), an indium zinc oxide (IZO), a zinc oxide (ZnO), an indium oxide ($In_2O_3$), an indium gallium oxide (IGO), and/or an aluminum zinc oxide (AZO).

The intermediate layer 220 may include an organic material including a fluorescent or phosphorescent material that emits red, green, and/or blue light, and may be patterned to correspond to the pixel P of the display area DA.

The intermediate layer 220 may include an emission layer 223. At least one functional layer of a first functional layer 221 between the emission layer 223 and the pixel electrode 210, and/or a second functional layer 222 between emission layer 223 and the counter electrode 230, may be provided at respective upper and/or lower portions of the emission layer 223, and may be provided with the emission layer 223 therebetween. The first functional layer 221 and the second functional layer 222, unlike the emission layer 223 patterned on the pixel electrode 210, may be common layers formed across the entire surface of the display area DA.

The first functional layer 221 may include, for example, at least one of a hole injection layer (HIL) or a hole transport layer (HTL). The hole injection layer HIL may facilitate emission of holes from an anode, and the hole transport layer HTL may facilitate transmission of holes of the hole injection layer HIL to the emission layer. The second functional layer 222 may include at least one of an electron transport layer (ETL) or the electron injection layer EIL. The electron injection layer EIL may facilitate emission of electrons from a cathode, and the electron transport layer ETL may facilitate transmission of electrons of the electron injection layer EIL to the emission layer.

The thin film encapsulation layer 300 is located on the organic light-emitting diode OLED. Although FIG. 4A illustrates that the thin film encapsulation layer 300 is located in the display area DA, the thin film encapsulation layer 300 may be partially located in the peripheral area PA, as illustrated in FIG. 2.

The thin film encapsulation layer 300 may include first and second inorganic encapsulation layers 310 and 330 and an organic encapsulation layer 320. For example, the thin film encapsulation layer 300 may be formed by sequentially stacking the first inorganic encapsulation layer 310, the organic encapsulation layer 320, and the second inorganic encapsulation layer 330. The first and second inorganic encapsulation layers 310 and 330 may include at least one material of silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride. The first and second inorganic encapsulation layers 310 and 330 may be formed, for example, in a chemical vapor deposition (CVD) process.

The organic encapsulation layer 320 may include at least one material selected from the group consisting of acrylic resin, methacrylic resin, polyisoprene, vinyl resin, epoxy resin, urethane resin, cellulose resin, and/or perylene resin. In some embodiments, the organic encapsulation layer 320 may be formed in an atomic layer deposition (ALD) process in which a material such as hexamethyldisiloxane (HMDSO) or tetraethyl orthosilicate (TEOS) is used as a raw material gas. In other embodiments, the organic encapsulation layer 320 may be formed by depositing a liquid monomer and then curing the deposited liquid monomer by using heat or light such as an ultraviolet ray.

Although a case is described in which the thin film encapsulation layer 300 includes the two first and second inorganic encapsulation layers 310 and 330 and the one organic encapsulation layer 320, the stacking sequence and the number of an inorganic encapsulation layer and an organic encapsulation layer are not limited thereto.

The pixel circuit PC of FIG. 4B is different from the pixel circuit PC of FIG. 4A in terms of structure. As some features are the same as those described in FIG. 4A, in the following description, the structural differences of the pixel circuit PC are mainly described.

Referring to FIG. 4B, a pixel P' located in the display area DA may include a pixel circuit PC', and the pixel circuit PC' may include a thin film transistor TFT' and a storage capacitor Cst'. The thin film transistor TFT' of FIG. 4B may be one of the thin film transistors T1-T7 of FIG. 3B, for example, the driving TFT T1.

The pixel circuit PC' may include the thin film transistor TFT' and the storage capacitor Cst'. A pixel circuit layer 110' may include a buffer layer 101', a gate insulating layer 103', a dielectric insulating layer 105', a second interlayer insulating layer 107', and a planarization layer 109', which are sequentially located on the substrate 100.

The buffer layer 101' is located on the substrate 100 to reduce or prevent intrusion of impurities. The gate insulating layer 103' is provided between a semiconductor layer 211' and a gate electrode 213' of the thin film transistor TFT'. The dielectric insulating layer 105' is provided between a lower electrode 217' and an upper electrode 219' of the storage capacitor Cst'. The second interlayer insulating layer 107' is provided between the gate electrode 213', a source electrode 215s', and a drain electrode 215d' of the thin film transistor TFT'.

The buffer layer 101', the gate insulating layer 103', the dielectric insulating layer 105', the second interlayer insulating layer 107', and the planarization layer 109' may all include an insulating inorganic material. For example, each of the buffer layer 101', the gate insulating layer 103', the dielectric insulating layer 105', the second interlayer insulating layer 107', and the planarization layer 109' may include silicon nitride, silicon oxide, and/or silicon oxynitride.

Although FIG. 4B illustrates a case in which the thin film transistor TFT' and the storage capacitor Cst' are located to overlap each other, the gate electrode 213' of the thin film transistor TFT' functioning as the lower electrode 217' of the storage capacitor Cst', the disclosure is not limited thereto.

Figure 5:
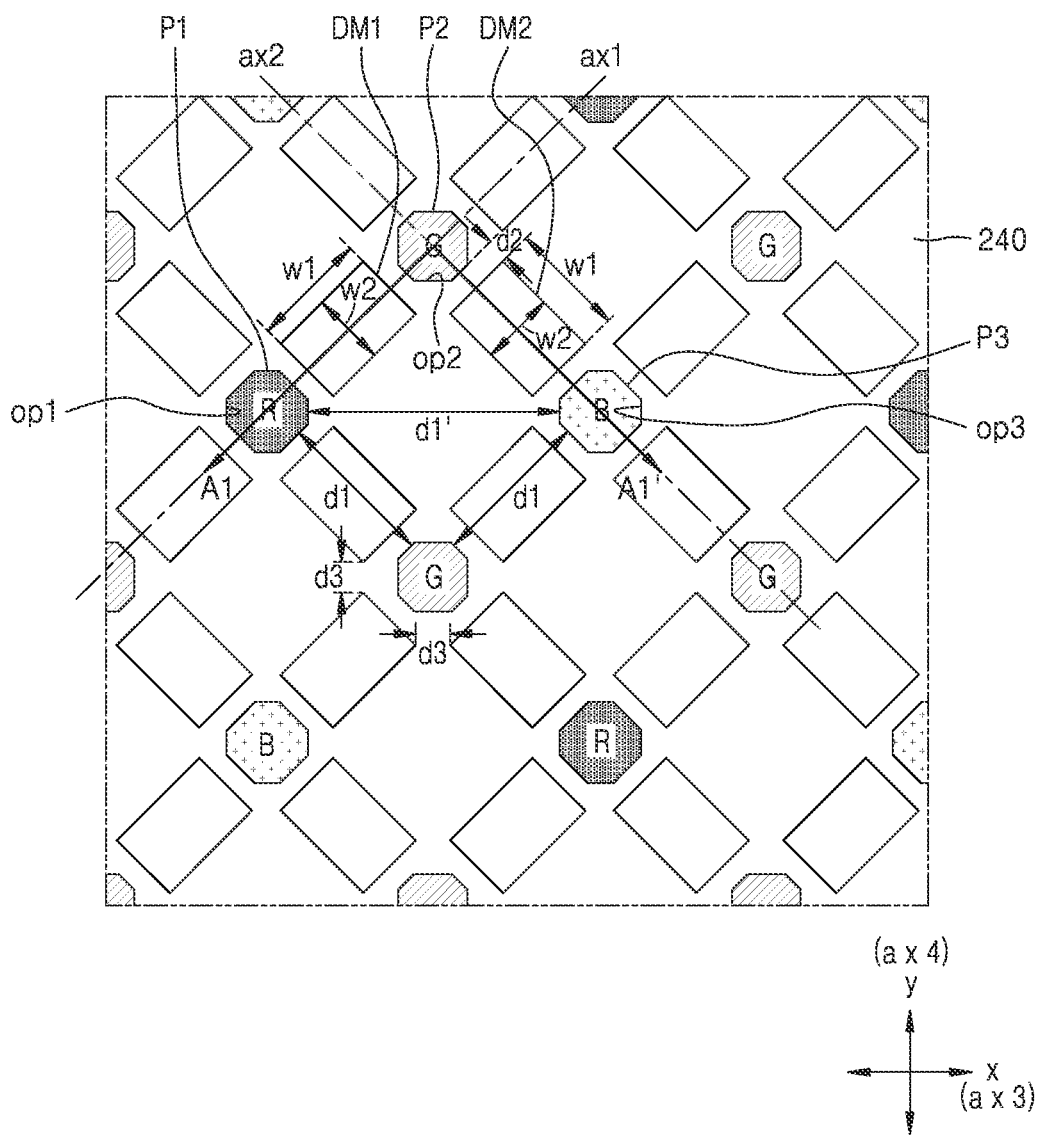
FIG. 5 is a schematic plan view of a part of a display area of a display apparatus according to some embodiments of the disclosure.
Figure 6:
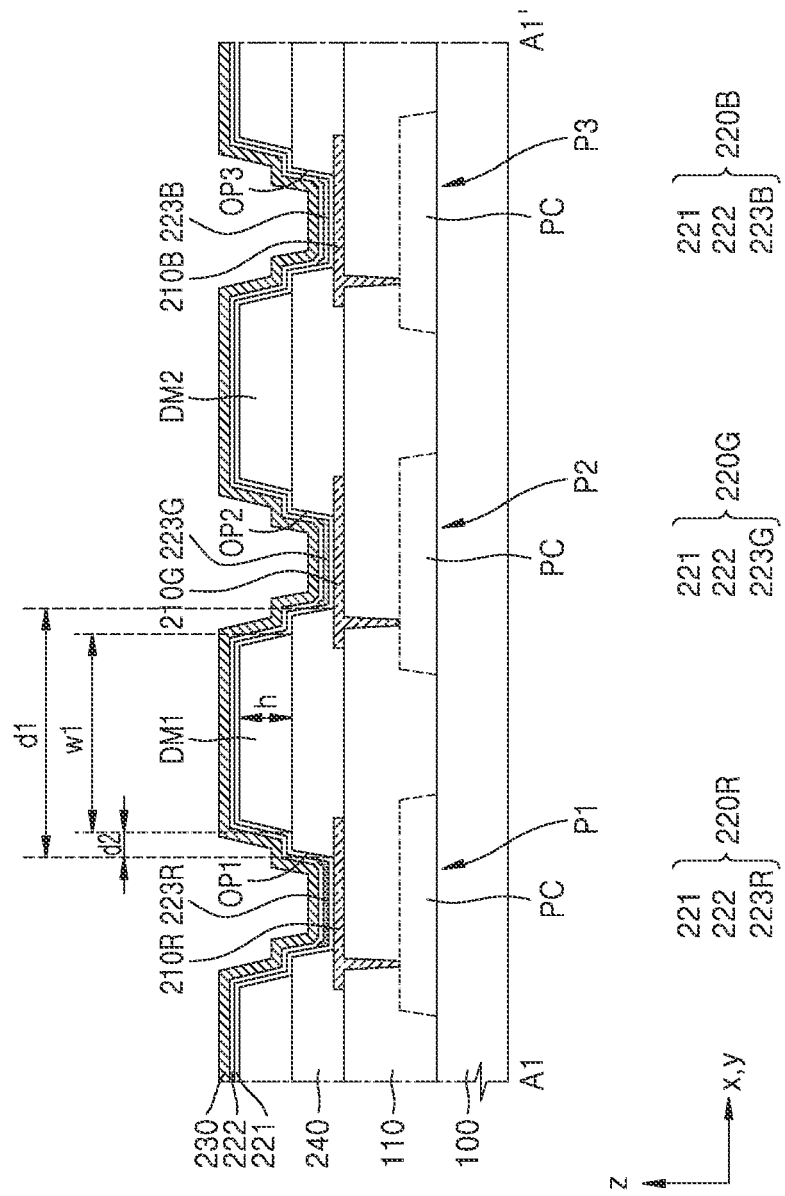
FIG. 6 is a schematic cross-sectional view taken along the line A1-A1' of FIG. 5.

FIG. 5 is a schematic plan view of a part of the display area DA of a display apparatus according to some embodiments of the disclosure. FIG. 6 is a schematic cross-sectional view taken along the line A1-A1' of FIG. 5.

Referring to FIG. 5, a plurality of pixels P1, P2, and P3 may be located in the display area DA. The pixels P1, P2, and P3 may include the first pixel P1, the second pixel P2, and the third pixel P3. Although FIG. 5 illustrates that the pixels P1, P2, and P3 are located in a diamond pentile type, the present disclosure is not limited thereto. The pixels P1, P2, and P3 may be located, for example, in a stripe type or a general pentile type.

Each of the first pixel P1, the second pixel P2, and the third pixel P3 includes a plurality of pixels, and may emit light of a different color from one another. In some embodiments, the first pixel P1 may emit red light, the second pixel P2 emits green light, and the third pixel P3 may emit blue light. In some embodiments, an emission area of the first pixel P1 for emitting red light and an emission area of the third pixel P3 for emitting blue light may be greater than an emission area of the second pixel P2 for emitting green light.

Referring to FIG. 6, each of the first pixel P1, the second pixel P2, and the third pixel P3 is connected to the pixel circuit PC located on the substrate 100, and may include first to third pixel electrodes 210R, 210G, and 210B. First to third intermediate layers 220R, 220G, and 220B may be respectively located on the first to third pixel electrodes 210R, 210G, and 210B. In detail, the first functional layer 221 and the second functional layer 222, as common layers, may be located on the first to third pixel electrodes 210R, 210G, and 210B, and first to third emission layers 223R, 223G, and 223B each may be located between the first functional layer 221 and the second functional layer 222.

Referring to FIG. 5, a plurality of first pixels P1 and a plurality of second pixels P2 may be alternately located in a first direction ax1 that is a diagonal direction crossing the x and y axes. Furthermore, a plurality of third pixels P3 and a plurality of second pixels P2 may be alternately located in a second direction ax2 that is a diagonal direction crossing the x and y axes. The first direction ax1 and the second direction ax2 are directions crossing each other, for example, orthogonal to each other.

Four pixels having the above pixel arrangement structure may be located in a rhombus shape. In other words, a virtual line connecting respective ones of the closest pixels of one first pixel P1, two second pixels P2, and one third pixel P3 may make a rhombus shape. Accordingly, a distance, for example, d1, between the pixels located in the first direction ax1 or the second direction ax2 is less than a distance, for example, d1', between the pixels located in a third direction ax3 (e.g., the x direction), or a fourth direction ax4 (e.g., a y direction). Furthermore, as the display area DA becomes high resolution, a distance between pixels gradually decreases.

In this case, a leakage current may be generated between the first pixel P1 and the second pixel P2, and between the second pixel P2 and the third pixel P3, in which a distance therebetween is relatively short, and thus color mixing may occur between respective ones of the pixels. As the leakage current is transmitted to a neighboring pixel through an organic material layer located in the pixels P1, P2, and P3 as a common layer (e.g., through the first functional layer 221 and/or the second functional layer 222), a current path along the first functional layer 221 and/or the second functional layer 222 may be increased.

Accordingly, as illustrated in FIGS. 5 and 6, a first dam portion DM1 is located between the first pixel P1 and the second pixel P2, and a second dam portion DM2 is located between the second pixel P2 and the third pixel P3. Thus, a horizontal distance between the first pixel P1 and the second pixel P2, and between the second pixel P2 and the third pixel P3 (e.g., a path of the organic material layer) is increased, and thus the leakage current may be reduced so that the occurrence of color mixing between pixels may be prevented.

Figure 9:
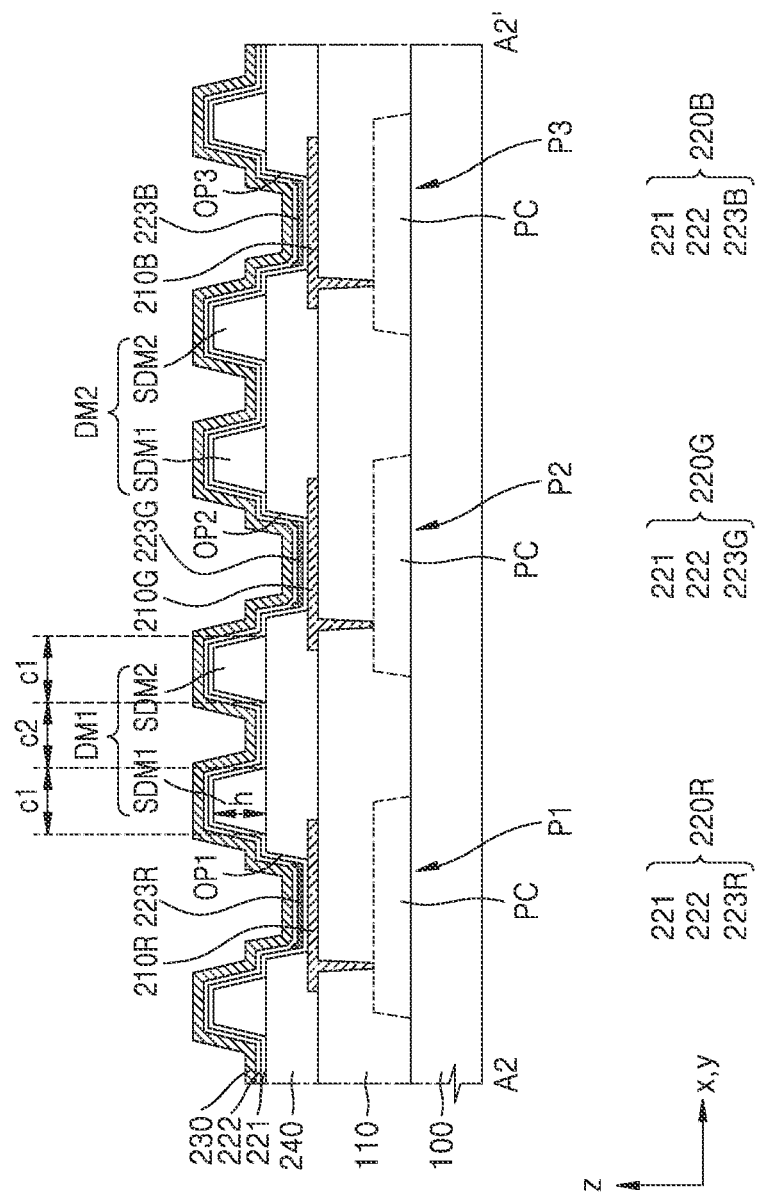
FIG. 9 is a schematic cross-sectional view taken along the line A2-A2' of FIG. 8.
Figure 10:
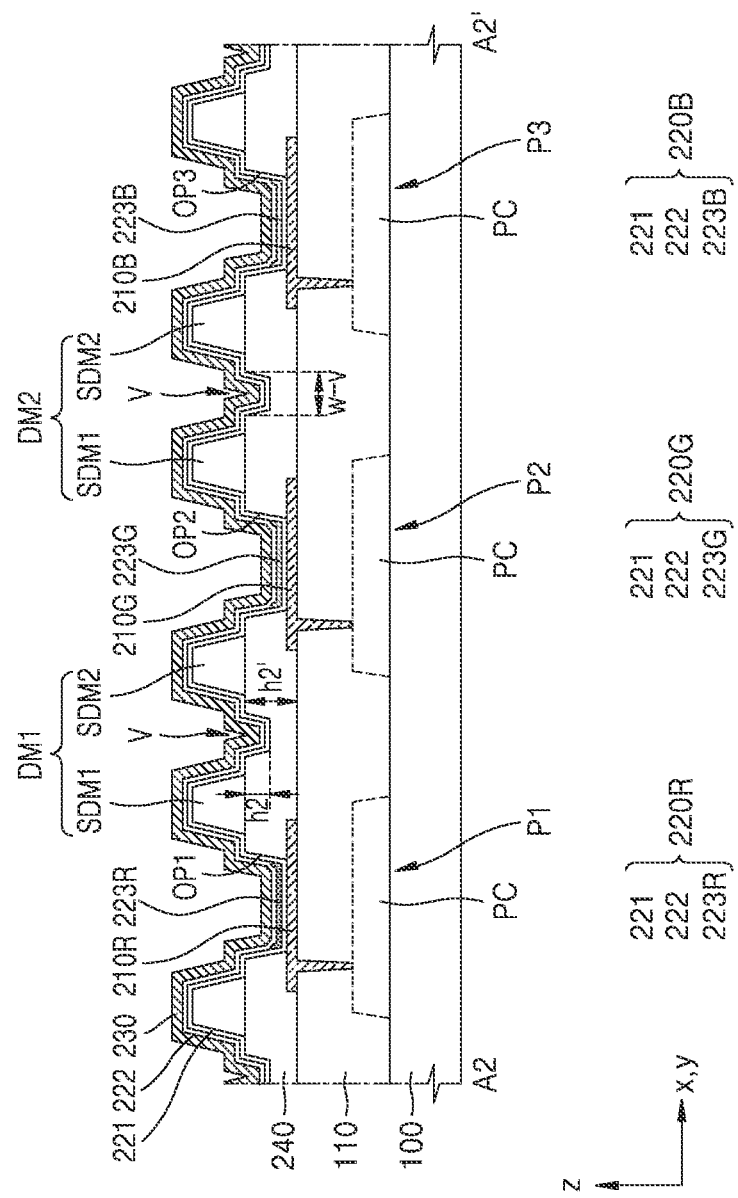
FIG. 10 illustrates a modified example of FIG. 9.
Figure 13:
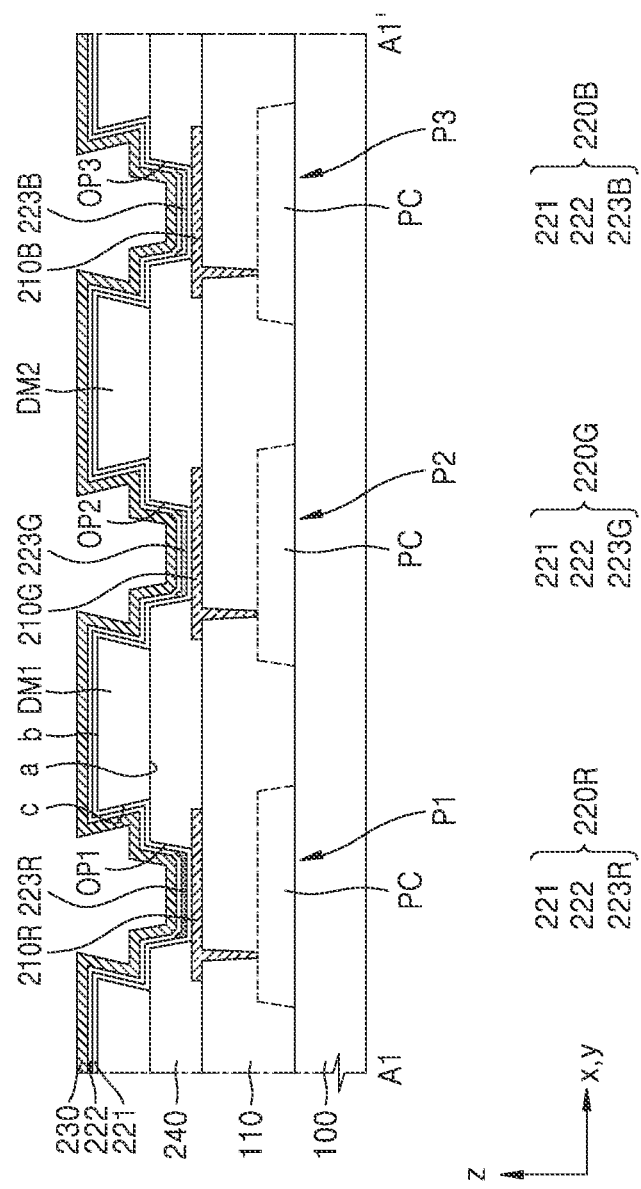
FIGS. 13 and 14 are schematic cross-sectional views of a part of a display area of a display apparatus according to embodiments of the disclosure.
Figure 14:
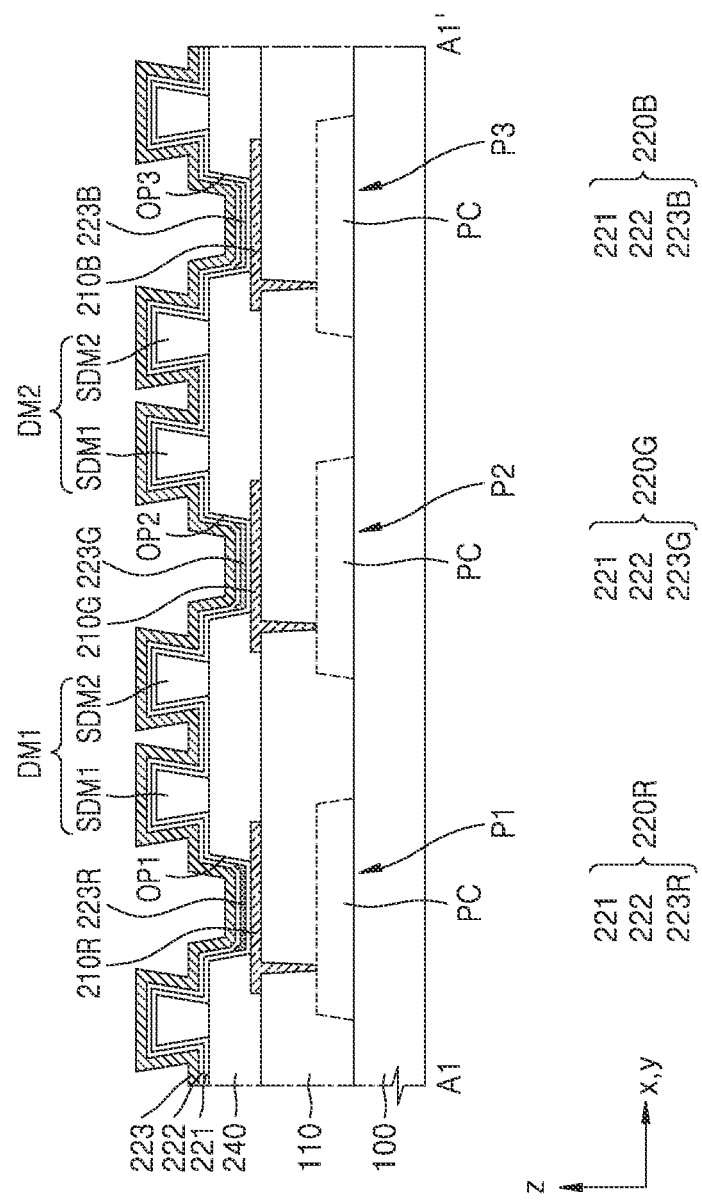

Referring to FIG. 6, for example, as the first dam portion DM1 is located between the first pixel P1 and the second pixel P2, a horizontal distance (e.g., the path of the organic material layer) may be increased to be about twice the height h of the first dam portion DM1 (e.g., as compared to a case of having no first dam portion DM1). When each of the first and second dam portions DM1 and DM2 includes a first sub-dam SDM1 and a second sub-dam SDM2 (as illustrated in FIG. 9, described below), the path of the organic material layer may be increased to be about four times the height h of the first dam portion DM1. Furthermore, when a valley V is formed between the first sub-dam SDM1 and the second sub-dam SDM2 (as illustrated in FIG. 10, described below), in addition to the features shown in FIG. 9, the path of the organic material layer may be increased the be about at least twice a depth h2 of the valley V. When the first and second dam portions DM1 and DM2 each have an inversely tapered shape (as illustrated in FIGS. 13 and 14, described below), the path of the organic material layer may be slightly increased further as compared to that shown in FIG. 6 or FIG. 9 in which the section thereof has a regularly tapered shape.

Referring back to FIG. 5, in the plane/plan view illustrated in FIG. 5, the first dam portion DM1 and the second dam portion DM2 each may have an approximately polygonal shape. In some embodiments, FIG. 5 illustrates that each of the first dam portion DM1 and the second dam portion DM2 has a rectangular shape. In other embodiments, corners of the first dam portion DM1 and the second dam portion DM2 may be chamfered/may have a chamfered shape. The chamfered shape may be generated during a process, and the corners of the first dam portion DM1 and the second dam portion DM2 may not necessarily have a chamfered shape.

Each of the first dam portion DM1 and the second dam portion DM2 may have a first width w1 in a major-axis direction and a second width w2 in a minor-axis direction. In FIG. 5, the major-axis direction of the first dam portion DM1 may mean the first direction ax1, and the minor-axis direction may mean the second direction ax2. Furthermore, the major-axis direction of the second dam portion DM2 may mean the second direction ax2, and the minor-axis direction may mean the first direction ax1.

In some embodiments, in the first dam portion DM1 and the second dam portion DM2, the first width w1 may be about 8 μm to about 12 μm, and the second width w2 may be about 4 μm to about 8 μm. For example, the first width w1 may be about 10 μm to about 11 μm and the second width w2 may be about 6 μm to about 7 μm. Referring to FIG. 6, it is sufficient that the height h of each of the first dam portion DM1 and the second dam portion DM2 is 2 μm or more. In some embodiments, the height h of each of the first dam portion DM1 and the second dam portion DM2 may be about 2 μm to about 3.5 μm (e.g., about 2.5 μm to about 3 μm).

The first pixel P1, the second pixel P2, and the first dam portion DM1 may be arranged in the first direction ax1, and the second pixel P2, the third pixel P3, and the second dam portion DM2 may be arranged in the second direction ax2. As described above, a shortest distance d1 between the first pixel P1 and the second pixel P2 in the first direction ax1 may be shorter (e.g., on the plane/in a plan view) than a shortest distance d1' between the first pixel P1 and the third pixel P3 in the third direction ax3 (e.g., the x direction). Likewise, the shortest distance d1 between the second pixel P2 and the third pixel P3 in the second direction ax2 may be shorter (e.g., on the plane/in a plan view) than the shortest distance d1' between the first pixel P1 and the third pixel P3 in the third direction ax3 (e.g., the x direction). In some embodiments, the shortest distance d1 between the first pixel P1 and the second pixel P2 and the shortest distance d1 between the second pixel P2 and the third pixel P3 may be identical to each other.

As such, as the shortest distance d1 between the first pixel P1 and the second pixel P2, and between the second pixel P2 and the third pixel P3, is shorter than the shortest distance d1' between the first pixel P1 and the third pixel P3, by arranging the first dam portion DM1 and the second dam portion DM2 respectively between the first pixel P1 and the second pixel P2, and between the second pixel P2 and the third pixel P3, a horizontal distance (e.g., the path of the organic material layer) between the first pixel P1 and the second pixel P2, and between the second pixel P2 and the third pixel P3, may be increased.

In some embodiments, the shortest distance d1 between the first pixel P1 and the second pixel P2 may be less than about 17 μm (e.g., about 15 μm or less). Furthermore, the shortest distance d1' between the first pixel P1 and the third pixel P3 may be about 17 μm or more (e.g., about 20 μm to about 25 μm).

According to an experimental result, when the shortest distance between the pixels is about 17 μm or more, a color mixing problem due to the leakage current does not arise, and when the shortest distance between the pixels is less than about 17 μm, the color mixing problem due to the leakage current is generated. The leakage current may be generated through the first functional layer 221 and/or the second functional layer 222 provided as a common layer. In the display apparatus 1 according to some embodiments of the disclosure, the first dam portion DM1 and the second dam portion DM2 are located on the pixel defining layer 240 to increase the horizontal distance between the first pixel P1 and the second pixel P2, and the horizontal distance between the second pixel P2 and the third pixel P3. Thus the path of the organic material layer where the first functional layer 221 and/or the second functional layer 222 are formed is increased, thereby reducing the leakage current transmitted to the neighboring pixel and effectively preventing the color mixing problem between the pixels.

In an example, when the shortest distance between the pixels is designed to be about 12 μm, as described above, the color mixing problem is generated between the pixels. In this state, by arranging the first dam portion DM1 having the height h of about 2.5 μm between the first pixel P1 and the second pixel P2, the path of the organic material layer may be increased by about 5 μm. Thus, while the shortest distance between the pixels is sufficiently reduced, the path of the organic material layer between pixels may be controlled through a structure located between the pixels (e.g., the first dam portion DM1 and the second dam portion DM2).

A shortest distance d2 between respective openings OP1, OP2, and OP3 of the pixel defining layer 240 and the first dam portion DM1 or the second dam portion DM2 that is adjacent thereto may be 3 μm or less. The shortest distance d2 being about 3 μm or less may mean that the shortest distance d2 is about 0. In other words, the first dam portion DM1 or the second dam portion DM2 may be continuously provided without a separation space from the openings OP1, OP2, and OP3. However, when the shortest distance d2 exceeds about 3 μm, the first width w1 of each of the first dam portion DM1 and the second dam portion DM2 is relatively decreased so that the horizontal distance between the pixels (e.g., the path of the organic material layer) may not be sufficiently secured. Accordingly, the shortest distance d2 between the openings OP1, OP2, and OP3 of the pixel defining layer 240 and the first dam portion DM1 or the second dam portion DM2 adjacent thereto may be about 3 μm or less (e.g., about 2 μm or less).

Referring back to FIG. 5, a shortest distance d3 between the first dam portion DM1 and the second dam portion DM2 in the third direction ax3 (e.g., the x direction), or in the fourth direction ax4 (e.g., the y direction), may be about 3 μm or less. In this state, the shortest distance d3 being about 3 μm or less may mean that the shortest distance d2 may be about 0. In other words, the first dam portion DM1 and the second dam portion DM2 may be provided to contact each other. In this case, the emission area of each of the pixels P1, P2, and P3 may be entirely surrounded by a plurality of respective first and second dam portions DM1 and DM2.

The first dam portion DM1 and the second dam portion DM2 may include an insulating organic material. The first dam portion DM1 and the second dam portion DM2 may include the same material as the pixel defining layer 240, or may include a different material therefrom. In FIG. 6, the first dam portion DM1 and the second dam portion DM2, which are separate layers located on the pixel defining layer 240, include a material that is different from the pixel defining layer 240. For example, the first dam portion DM1 and the second dam portion DM2 may include the same material as a spacer located on the pixel defining layer 240.

Figure 7:
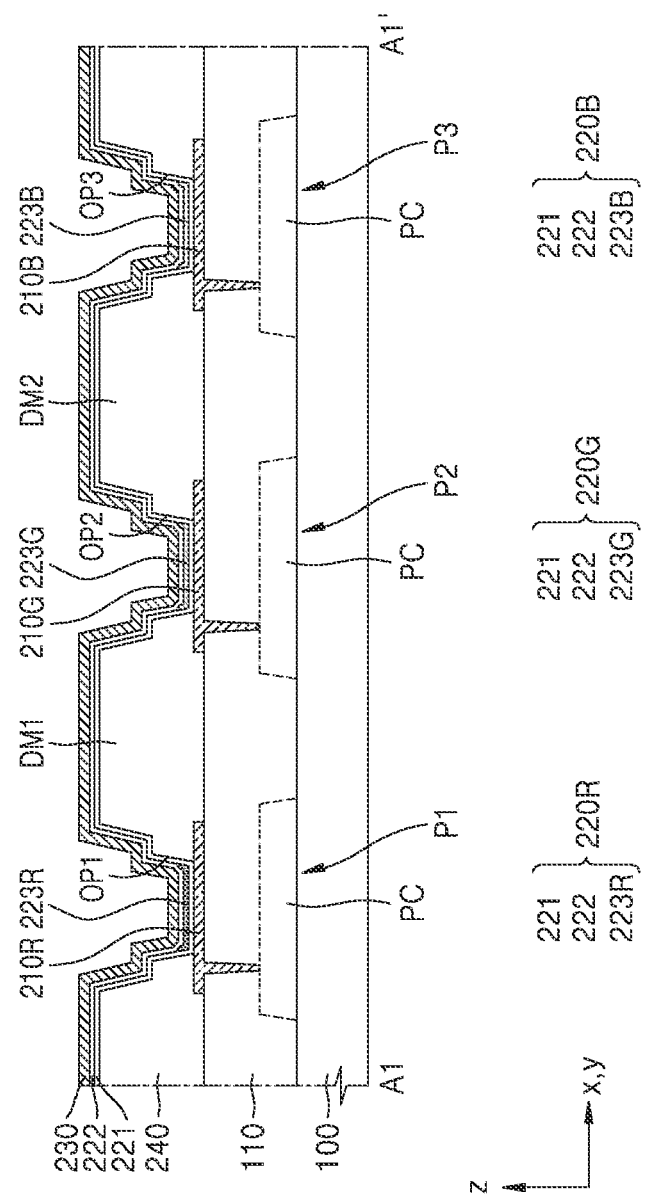
FIG. 7 illustrates a modified example of FIG. 5.

As illustrated in FIG. 7, the first dam portion DM1 and the second dam portion DM2 may be integrally provided with the pixel defining layer 240. In this case, the pixel defining layer 240 and the first and second dam portions DM1 and DM2 may be formed by using a half-tone mask.

Figure 8:
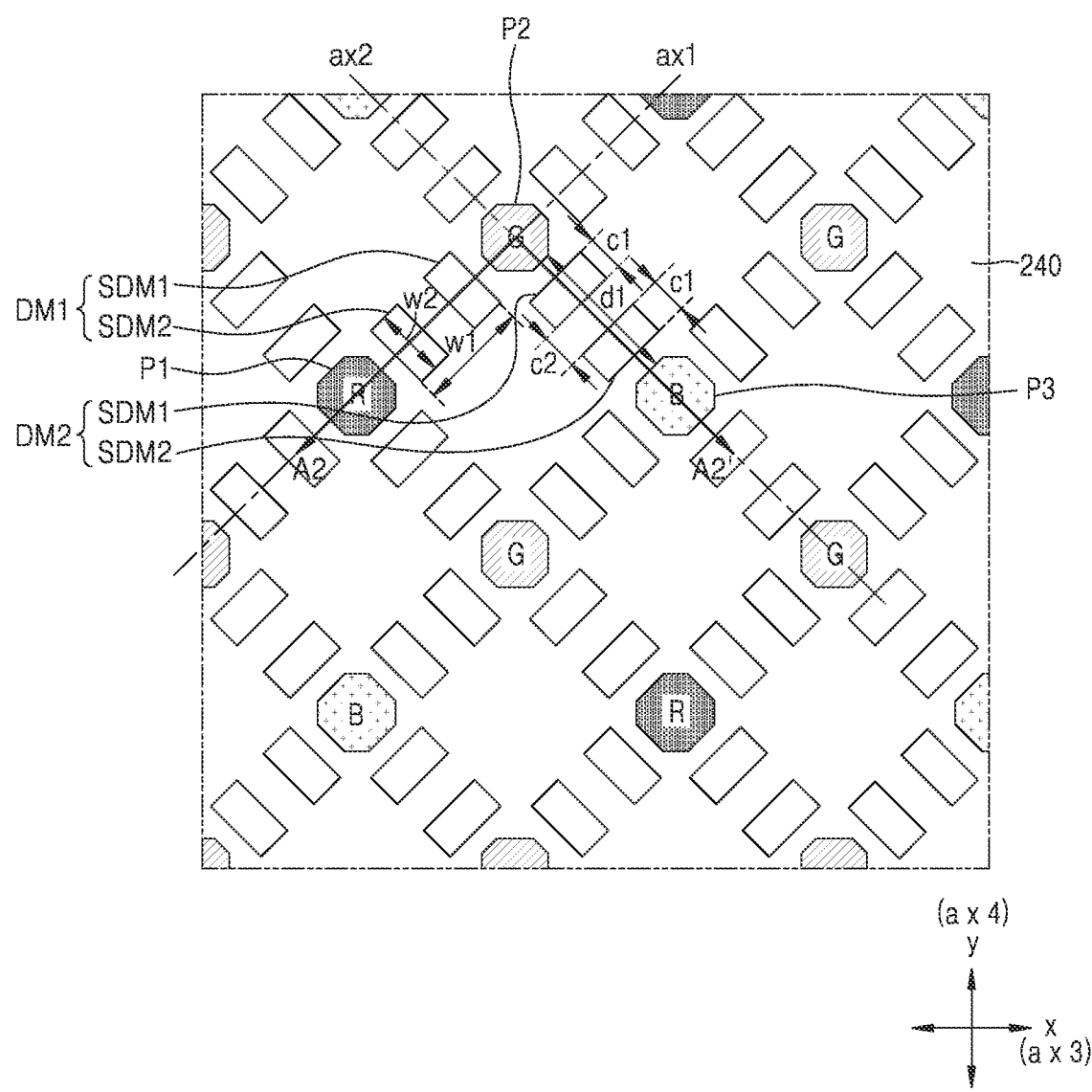
FIG. 8 is a schematic plan view of a part of a display area of a display apparatus according to some embodiments of the disclosure.

FIG. 8 is a schematic plan view of a part of a display area of a display apparatus according to some embodiments of the disclosure display, and FIG. 9 is a schematic cross-sectional view taken along the line A2-A2' of FIG. 8.

FIGS. 8 and 9 correspond to a modified example of FIGS. 5 and 6. Embodiments corresponding to FIGS. 8 and 9 may be different from embodiments corresponding to FIGS. 5 and 6 in terms of the structures of the first and second dam portions DM1 and DM2. As the other elements are the same as those described in FIGS. 5 and 6, in the following description, differences based on the structures of the first and second dam portions DM1 and DM2 are mainly described.

The first and second dam portions DM1 and DM2 may respectively include the first sub-dam SDM1 and the second sub-dam SDM2. The first sub-dam SDM1 and the second sub-dam SDM2 may have a first width c1, and may be apart from each other by a first distance c2. In this state, for the first dam portion DM1, the first width c1 and the first distance c2 may respectively mean a width and a distance in the first direction ax1, and for the second dam portion DM2, the first width c1 and the first distance c2 may respectively mean a width and a distance in the second direction ax2.

In some embodiments, the first width c1 of each of the first sub-dam SDM1 and the second sub-dam SDM2 may be about 2 μm to about 5 μm (e.g., about 3 μm to about 4 μm). Although FIGS. 8 and 9 illustrate that the first sub-dam SDM1 and the second sub-dam SDM2 have the same the first width c1, the present disclosure is not necessarily limited thereto. The first width c1 of the first sub-dam SDM1 and the first width c1 of the second sub-dam SDM2 may be different from each other.

Furthermore, the first distance c2 between the first sub-dam SDM1 and the second sub-dam SDM2 may be about 1 μm to about 3 μm. When the first distance c2 between the first sub-dam SDM1 and the second sub-dam SDM2 is about 0, embodiments corresponding to FIGS. 8 and 9 may be the same as those corresponding to FIGS. 5 and 6.

The display apparatus 1 may further increase the horizontal distance between pixels because the first and second dam portions DM1 and DM2 respectively include the first sub-dam SDM1 and the second sub-dam SDM2. Thus, the path of the organic material layer where the first functional layer 221 and/or the second functional layer 222 are formed is increased, thereby reducing the leakage current transmitted to the neighboring pixel and effectively preventing the color mixing problem between the pixels.

Figure 11:
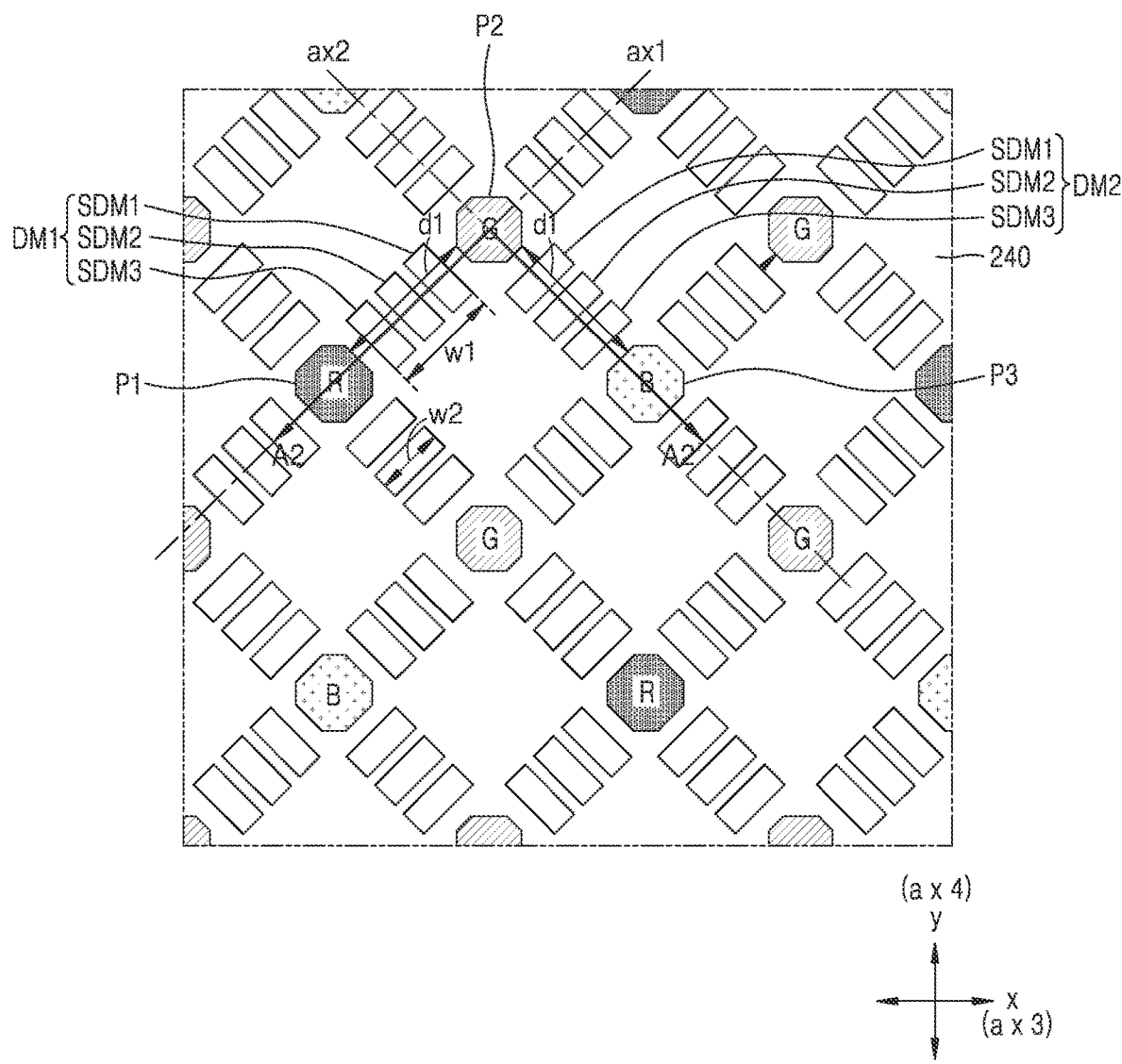
FIGS. 11 and 12 illustrate modified examples of FIG. 5.
Figure 12:
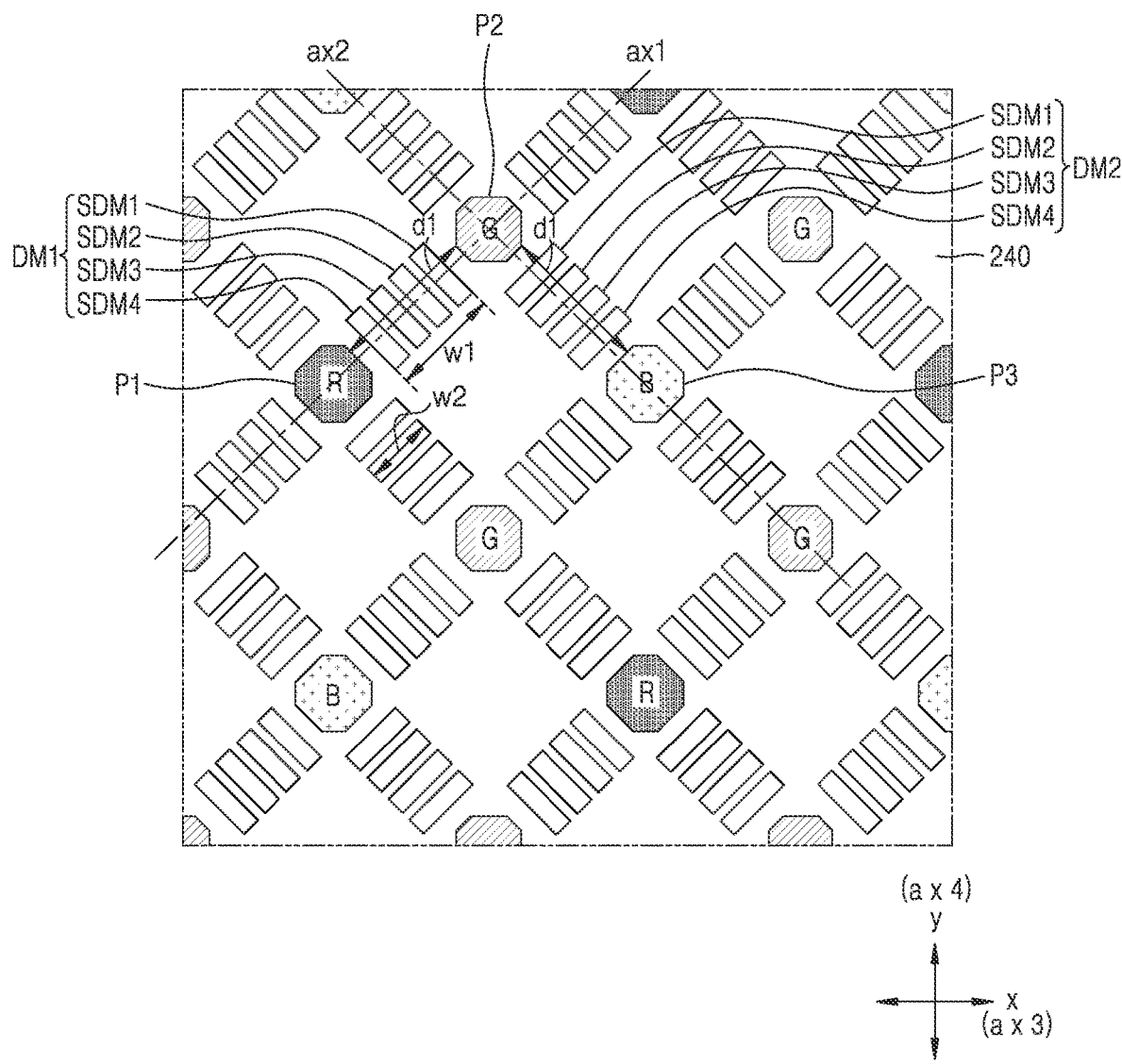

Although FIG. 8 illustrates that the first and second dam portions DM1 and DM2 respectively include two sub-dams SDM1 and SDM2, each of the first and second dam portions DM1 and DM2 may include three or more sub-dams in other embodiments. For example, FIG. 11 illustrates an embodiment in which the first and second dam portions DM1 and DM2 each include three sub-dams SDM1, SDM2, and SDM3, and FIG. 12 illustrates an embodiment in which the first and second dam portions DM1 and DM2 each include four sub-dams SDM1, SDM2, SDM3, and SDM4. In FIGS. 11 and 12, the shortest distance d1 between the first pixel P1 and the second pixel P2, and the first width w1 and the second width w2 of the first and second dam portions DM1 and DM2, each may be the same as those in embodiments corresponding to FIG. 5 or FIG. 8.

Referring to FIG. 10, the valley V may be further provided between the first sub-dam SDM1 and the second sub-dam SDM2. The valley V may have a shape of a recess or groove as if a part of the pixel defining layer 240 is withdrawn in a direction toward the substrate 100. The depth h2 of the valley V may be about ½ or more of a thickness h2' of the pixel defining layer 240, although the present disclosure is not necessarily limited thereto. A width w-v of the valley V may be, at its maximum, the first distance c2 between the first sub-dam SDM1 and the second sub-dam SDM2.

In the display apparatus 1 according to embodiments corresponding to FIG. 10, as the valley V is provided between the first sub-dam SDM1 and the second sub-dam SDM2, the horizontal distance between the first pixel P1 and the second pixel P2, the horizontal distance between the second pixel P2 and the third pixel P3, may be further increased by the depth h2 of the valley V. Thus, the path of the organic material layer between pixels (e.g., a path where the first functional layer 221 and/or the second functional layer 222 are formed) is increased, and thus a leakage current that is transmitted to the neighboring pixel through the first functional layer 221 and/or the second functional layer 222 may be reduced and the color mixing problem between pixels may be effectively prevented.

FIGS. 13 and 14 are schematic cross-sectional views of a part of a display area of a display apparatus according to embodiments of the disclosure.

FIGS. 13 and 14 correspond to a modified example of FIGS. 5 and 6. The embodiments corresponding to FIGS. 8 and 9 may be different from embodiments corresponding to FIGS. 5 and 6 in terms of the structures of the first and second dam portions DM1 and DM2. As the other elements are the same as those described in FIGS. 5 and 6, in the following description, differences corresponding to the structures of the first and second dam portions DM1 and DM2 are mainly described.

Referring to FIG. 13, each of the first and second dam portions DM1 and DM2 may have an inversely tapered shape. The first and second dam portions DM1 and DM2 each having an inversely tapered shape may mean that the section of each of the first and second dam portions DM1 and DM2 has an inversely tapered shape in which, in each of the first and second dam portions DM1 and DM2, a width of an upper surface b is greater than a width of a lower surface a, and an angle between a side surface c of each of the first and second dam portions DM1 and DM2 and an upper surface of the pixel defining layer 240 is obtuse exceeding 90°. In this state, the lower surface a of each of the first and second dam portions DM1 and DM2 may be a surface directly contacting the pixel defining layer 240.

As such, when each of the first and second dam portions DM1 and DM2 has an inversely tapered shape, a horizontal distance between pixels with the first and second dam portions DM1 and DM2 therebetween may be further increased.

Referring to FIG. 14, the first and second dam portions DM1 and DM2 may respectively include the first sub-dam SDM1 and the second sub-dam SDM2, and the first sub-dam SDM1 and the second sub-dam SDM2 each may have an inversely tapered shape. Like the above-described embodiment of FIG. 11 or 12, each of the first and second dam portions DM1 and DM2 of FIG. 14 having an inversely tapered shape may include three or more sub-dams.

In other embodiments, the first functional layer 221 and/or the second functional layer 222 may not be located on the side surface c of each of the first and second dam portions DM1 and DM2 (e.g., depending on the angle of the side surface c of each of the first and second dam portions DM1 and DM2 according to the inversely tapered shape). In other words, the first functional layer 221 and/or the second functional layer 222 may be discontinued in, or discontinuous at, the side surface c of each of the first and second dam portions DM1 and DM2 due to the inversely tapered shape. The leakage current between pixels may be further effectively reduced or prevented through the above structure.

Figure 15:
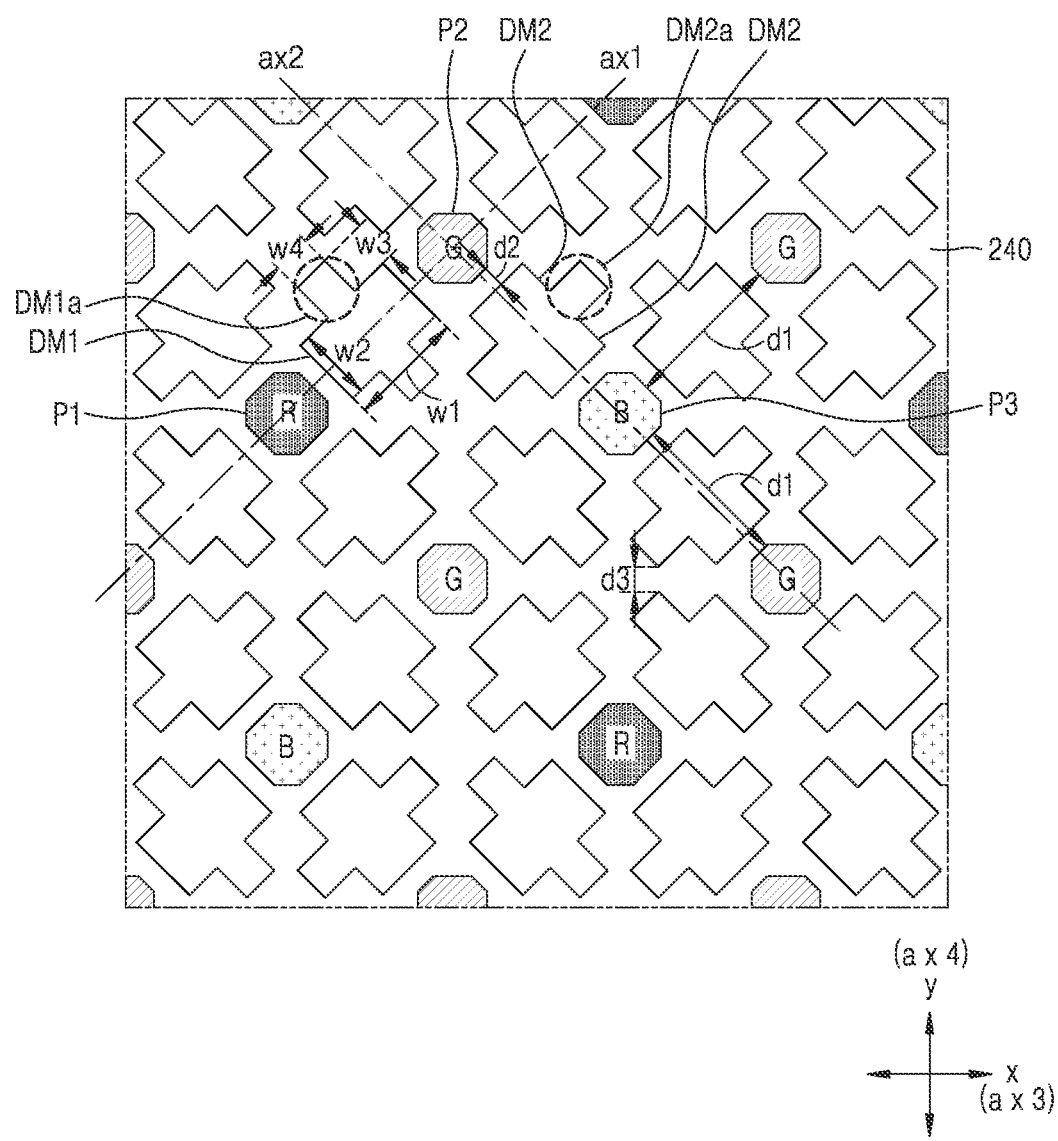
FIG. 15 is a schematic plan view of a part of a display area of a display apparatus according to some embodiments of the disclosure.

FIG. 15 is a schematic plan view of a part of a display area of a display apparatus according to some embodiments of the disclosure.

Referring to FIG. 15, on the plane, the first and second dam portions DM1 and DM2 are substantially the same as those of embodiments corresponding to FIG. 5, and may further include first and second protruding portions DM1a and DM2a respectively protruding in one side and the other side. The first dam portion DM1 may include the first protruding portions DM1a protruding in the minor-axis direction (e.g., in the second direction ax2), and the second dam portion DM2 may include the second protruding portions DM2a protruding in the minor-axis direction (e.g., in the first direction ax1).

The first and second protruding portions DM1a and DM2a each may have a third width w3 in a protruding direction (e.g., in the minor-axis direction), and a fourth width w4 in the major-axis direction. For example, the third width w3 may be about 1 μm to about 5 μm, and the fourth width w4 may be about 1 μm to about 5 μm. The other values w1, w2, d1, d2, and d3 in FIG. 15 may be the same as those in embodiments corresponding to FIG. 5, and thus detailed descriptions thereof are omitted.

As such, the shapes of the first and second dam portions DM1 and DM2 are not limited to a particular shape on the plane, and any shape capable of increasing the horizontal distance between the first pixel P1 and the second pixel P2, and between the second pixel P2 and the third pixel P3 (e.g., the path of the organic material layer) may be employed.

Although a display apparatus is mainly described above, the disclosure is not limited thereto. For example, it can be said that a method of manufacturing the display apparatus belongs to the scope of the disclosure.

According to embodiments of the disclosure, a display apparatus having improved image quality and a high resolution may be implemented. However, the scope of the disclosure is not limited to the above effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
a first pixel configured to emit red light, a second pixel configured to emit green light, and a third pixel configured to emit blue light spaced apart from one another, the second pixel spaced from the first pixel in a first direction, and spaced from the third pixel in a second direction crossing the first direction;
a pixel defining layer defining openings respectively corresponding to the first pixel, the second pixel, and the third pixel;
a first dam portion on the pixel defining layer between the first pixel and the second pixel along the first direction; and
a second dam portion on the pixel defining layer between the second pixel and the third pixel along the second direction,
wherein each of the first dam portion and the second dam portion has a rectangular shape with a first width in a major-axis direction, in a plan view,
wherein the major-axis direction of the first dam portion is a minor-axis direction of the second dam portion,
wherein the major-axis direction of the second dam portion is a minor-axis direction of the first dam portion, and
wherein a height of each of the first dam portion and the second dam portion is about 2 μm or more.

2. The display apparatus of claim 1, wherein the first width of each of the first dam portion and the second dam portion is about 8 μm to about 12 μm, and
wherein a second width in the minor-axis direction of each of the first dam portion and the second dam portion is about 4 μm to about 8 μm.

3. The display apparatus of claim 1, wherein the first width of each of the first dam portion and the second dam portion is less than a shortest distance between the first pixel and the second pixel.

4. The display apparatus of claim 1, wherein the first width of each of the first dam portion and the second dam portion is less than a shortest distance between the second pixel and the third pixel.

5. The display apparatus of claim 1, wherein a shortest distance between the first pixel and the second pixel is less than a shortest distance between the first pixel and the third pixel.

6. The display apparatus of claim 5, wherein the shortest distance between the first pixel and the second pixel is less than about 17 μm.

7. The display apparatus of claim 5, wherein the shortest distance between the first pixel and the third pixel is about 20 μm to about 25 μm.

8. The display apparatus of claim 7, further comprising a spacer on the pixel defining layer,
wherein the first dam portion and the second dam portion comprise a same material as the spacer.

9. The display apparatus of claim 1, wherein the first dam portion and the second dam portion are integrally provided with, and comprise a same material as, the pixel defining layer.

10. The display apparatus of claim 1, wherein the first dam portion and the second dam portion comprise a different material from the pixel defining layer.

11. The display apparatus of claim 1, wherein each of the first dam portion and the second dam portion has an inversely tapered shape.

12. The display apparatus of claim 1, wherein each of the first dam portion and the second dam portion comprises a first sub-dam and a second sub-dam spaced apart from each other by a first distance.

13. The display apparatus of claim 12, wherein the first distance is about 1 μm to about 3 μm.

14. The display apparatus of claim 12, wherein each of the first sub-dam and the second sub-dam has a third width in a major-axis direction, and a fourth width in a minor-axis direction,
wherein the major-axis direction of the first sub-dam is the minor-axis direction of the first dam portion and the minor-axis direction of the first sub-dam is the major-axis direction of the first dam portion, and
wherein the major-axis direction of the second sub-dam is the minor-axis direction of the second dam portion and the minor-axis direction of the second sub-dam is the major-axis direction of the second dam portion.

15. The display apparatus of claim 14, wherein the third width of each of the first sub-dam and the second sub-dam is the same as a second width in the minor-axis direction of each of the first dam portion and the second dam portion.

16. The display apparatus of claim 12, further comprising a valley between the first sub-dam and the second sub-dam corresponding to an indentation in the pixel defining layer.

17. The display apparatus of claim 1, wherein a shortest distance between a corresponding one of the openings of the pixel defining layer and the first dam portion or the second dam portion is about 3 μm or less.

18. The display apparatus of claim 1, wherein a shortest distance between the first dam portion and the second dam portion in a third direction is about 3 μm or less,
wherein the first direction and the second direction is between the third direction and a fourth direction crossing the third direction.

19. The display apparatus of claim 18, wherein the first dam portion comprises a plurality of first dam portions,
wherein the second dam portion comprises a plurality of second dam portions, and
wherein each of a shortest distance between the plurality of first dam portions and a shortest distance between the plurality of second dam portions is about 3 μm or less in the fourth direction.

20. The display apparatus of claim 1, wherein each of the first dam portion and the second dam portion comprises a protruding portion protruding in the minor-axis direction in a plan view, the protruding portion comprising an insulating organic material.

21. The display apparatus of claim 20, wherein the protruding portion has a width of about 1 μm to about 5 μm in the minor-axis direction, and has a width of about 1 μm to about 5 μm in the major-axis direction.

22. The display apparatus of claim 1, wherein the first dam portion and the second dam portion contact each other.

23. A display apparatus comprising:
- a first pixel electrode of a first pixel configured to emit a first color light, a second pixel electrode of a second pixel configured to emit a second color light, and a third pixel electrode of a third pixel configured to emit a third color light, the first pixel electrode and the second pixel electrode being located apart from each other in a first direction, and the second pixel electrode and the third pixel electrode being located apart from each other in a second direction crossing the first direction;
- a pixel defining layer having a first opening corresponding to a portion of the first pixel electrode, a second opening corresponding to a portion of the second pixel electrode, and a third opening corresponding to a portion of the third pixel electrode;
- a first dam portion on the pixel defining layer between the first pixel electrode and the second pixel electrode along the first direction; and
- a second dam portion on the pixel defining layer between the second pixel electrode and the third pixel electrode along the second direction,
- wherein a shortest distance between one of the first opening, the second opening or the third opening of the pixel defining layer and adjacent one of the first dam portion and the second dam portion is about 3 μm or less.

24. The display apparatus of claim 23, wherein a shortest distance between the first opening and the second opening is less than about 17 μm, and a shortest distance between the second opening and the third opening is less than about 17 μm.

* * * * *